United States Patent
Lee et al.

(10) Patent No.: US 12,107,979 B2
(45) Date of Patent: Oct. 1, 2024

(54) ELECTRONIC DEVICE CAPABLE OF FOLDING MOTION AND SLIDING MOTION

(71) Applicant: SAMSUNG ELECTRONICS CO., LTD., Suwon-si (KR)

(72) Inventors: Seungjoon Lee, Suwon-si (KR); Sungho Ahn, Suwon-si (KR); Youngseong Kim, Suwon-si (KR); Sungmin Hong, Suwon-si (KR); Jooyoung Kang, Suwon-si (KR); Yangwook Kim, Suwon-si (KR); Gyeongtae Park, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 396 days.

(21) Appl. No.: 17/373,218

(22) Filed: Jul. 12, 2021

(65) Prior Publication Data
US 2021/0409532 A1 Dec. 30, 2021

Related U.S. Application Data

(63) Continuation of application No. PCT/KR2021/007293, filed on Jun. 10, 2021.

(30) Foreign Application Priority Data

Jun. 10, 2020 (KR) ......................... 10-2020-0070411
May 6, 2021 (KR) ......................... 10-2021-0058736

(51) Int. Cl.
*H05K 1/14* (2006.01)
*G06F 1/16* (2006.01)
(Continued)

(52) U.S. Cl.
CPC ........ *H04M 1/0268* (2013.01); *G06F 1/1652* (2013.01); *G06F 1/1681* (2013.01);
(Continued)

(58) Field of Classification Search
CPC ............. H04M 1/0268; H04M 1/0216; H04M 1/0237; G06F 1/1652; G06F 1/1681;
(Continued)

(56) References Cited

U.S. PATENT DOCUMENTS 8,502,788 B2   8/2013   Cho
8,711,566 B2   4/2014   O'Brien
(Continued)

FOREIGN PATENT DOCUMENTS

CN      110806829 A       2/2020
KR   10-2010-0052227     5/2010
(Continued)

OTHER PUBLICATIONS

Search Report and Written Opinion dated Oct. 8, 2021 issued in International Patent Application No. PCT/KR2022/007292.
(Continued)

*Primary Examiner* — James Wu
*Assistant Examiner* — Christopher L Augustin
(74) *Attorney, Agent, or Firm* — Nixon & Vanderhye P.C.

(57) ABSTRACT

An electronic device includes: a base housing, a sliding housing at least partially overlapping the base housing and slidably coupled to the base housing, a folding housing least partially overlapping the base housing and connected to the sliding housing, a display disposed on the folding housing and the sliding housing, at least part of the display being located inside the base housing, a rolling module comprising a rollable support coupled to a rear surface of the display and having one side connected to the sliding housing and an opposite side extending into an inner space of the base
(Continued)

housing, and a hinge module comprising a hinge connected to the folding housing and the sliding housing wherein the sliding housing is configured to rotate about a first axis of rotation and the folding housing is configured to rotate about a second axis of rotation. The electronic device is configured to be capable of performing a sliding motion in which the folding housing and the sliding housing move in a sliding direction to extend or retract a display area of the electronic device and a folding motion in which the folding housing is folded or unfolded relative to the sliding housing to fold or unfold part of the display area.

19 Claims, 38 Drawing Sheets

(51) Int. Cl.
*H04M 1/02* (2006.01)
*H05K 1/02* (2006.01)

(52) U.S. Cl.
CPC ............ *H05K 1/028* (2013.01); *H05K 1/148* (2013.01); *H05K 2201/10128* (2013.01); *H05K 2201/10151* (2013.01); *H05K 2201/10159* (2013.01)

(58) Field of Classification Search
CPC ..... G06F 1/1616; G06F 1/1624; H05K 1/028; H05K 1/148; H05K 2201/10128; H05K 2201/10151; H05K 2201/10159; H05K 2201/051; H05K 1/147
See application file for complete search history.

(56) References Cited

U.S. PATENT DOCUMENTS

| | | | |
|---|---|---|---|
| 8,787,016 B2 | 7/2014 | Rothkopf et al. | |
| 9,183,770 B2 | 11/2015 | Lee et al. | |
| 9,195,272 B2 | 11/2015 | O'Brien | |
| 9,483,081 B2 | 11/2016 | Lee et al. | |
| 9,504,170 B2 | 11/2016 | Rothkopf et al. | |
| 9,514,573 B2 | 12/2016 | Grimaud | |
| 10,067,641 B2 | 9/2018 | Kim et al. | |
| 10,104,787 B2 | 10/2018 | Rothkopf et al. | |
| 10,152,086 B2 | 12/2018 | Choi et al. | |
| 10,152,201 B2 | 12/2018 | Kang et al. | |
| 10,423,019 B1 | 9/2019 | Song | |
| 10,534,534 B2 | 1/2020 | Cheong et al. | |
| 10,542,128 B2 | 1/2020 | Kang et al. | |
| 10,694,624 B2 | 6/2020 | Rothkopf et al. | |
| 10,742,784 B1* | 8/2020 | Jo | H04M 1/0237 |
| 10,747,269 B1* | 8/2020 | Choi | H04M 1/0237 |
| 10,809,767 B2 | 10/2020 | Ou et al. | |
| 10,820,433 B2* | 10/2020 | Cha | H05K 5/0226 |
| 10,868,264 B2 | 12/2020 | Shin et al. | |
| 10,878,728 B2 | 12/2020 | Yoon | |
| 10,880,417 B1* | 12/2020 | Song | G06F 1/1652 |
| 10,938,970 B1* | 3/2021 | Lee | H04M 1/0268 |
| 11,003,217 B2 | 5/2021 | Cha | |
| 11,304,316 B2 | 4/2022 | Rothkopf et al. | |
| 11,775,025 B2 | 10/2023 | Chen et al. | |
| 2010/0164837 A1* | 7/2010 | Kao | G06F 1/1616 345/1.3 |
| 2012/0314399 A1 | 12/2012 | Bohn et al. | |
| 2013/0010405 A1 | 1/2013 | Rothkopf et al. | |
| 2014/0282059 A1 | 9/2014 | Oh et al. | |
| 2016/0012797 A1 | 1/2016 | Lee et al. | |
| 2016/0026219 A1* | 1/2016 | Kim | H04M 1/0245 345/173 |
| 2016/0070303 A1 | 3/2016 | Lee et al. | |
| 2016/0366772 A1 | 12/2016 | Choi | |
| 2017/0139442 A1* | 5/2017 | Yoshizumi | G06F 1/1643 |
| 2018/0039408 A1 | 2/2018 | Cheong et al. | |
| 2018/0198896 A1 | 7/2018 | Kang et al. | |
| 2018/0260346 A1 | 9/2018 | Oh et al. | |
| 2019/0163241 A1* | 5/2019 | Moon | G06F 1/1641 |
| 2019/0305237 A1 | 10/2019 | Shin et al. | |
| 2020/0012412 A1 | 1/2020 | Kang et al. | |
| 2020/0020255 A1 | 1/2020 | Yoon | |
| 2020/0133340 A1 | 4/2020 | Ou et al. | |
| 2020/0249722 A1 | 8/2020 | Cha | |
| 2020/0253069 A1* | 8/2020 | Cha | G06F 1/1681 |
| 2021/0055840 A1 | 2/2021 | Kang et al. | |
| 2021/0098723 A1 | 4/2021 | Shin et al. | |

FOREIGN PATENT DOCUMENTS

| | | |
|---|---|---|
| KR | 10-2012-0092034 | 8/2012 |
| KR | 10-2014-0059274 | 5/2014 |
| KR | 10-2014-0147253 | 12/2014 |
| KR | 10-2015-0076119 | 7/2015 |
| KR | 10-2015-0094484 | 8/2015 |
| KR | 10-2016-0028839 | 3/2016 |
| KR | 10-2016-0038510 | 4/2016 |
| KR | 10-2016-0055646 | 5/2016 |
| KR | 10-2017-0006055 | 1/2017 |
| KR | 10-1784880 | 9/2017 |
| KR | 10-2019-0018361 | 2/2019 |
| KR | 10-2019-0113128 | 10/2019 |
| KR | 10-2019-0135159 | 12/2019 |
| KR | 10-2020-0007366 | 1/2020 |
| WO | WO 2016052814 A1 | 4/2016 |
| WO | WO 2018186631 A1 | 10/2018 |

OTHER PUBLICATIONS

International Search Report dated Oct. 8, 2021 in corresponding International Application No. PCT/KR2021/007293.
Extended European Search Report dated Oct. 11, 2023 for EP Application No. 21822720.5.
U.S. Office Action dated Nov. 3, 2023 for U.S. Appl. No. 18/077,441; Park.
U.S. Notice of Allowance dated Mar. 5, 2024 for U.S. Appl. No. 18/077,441; Park.

* cited by examiner

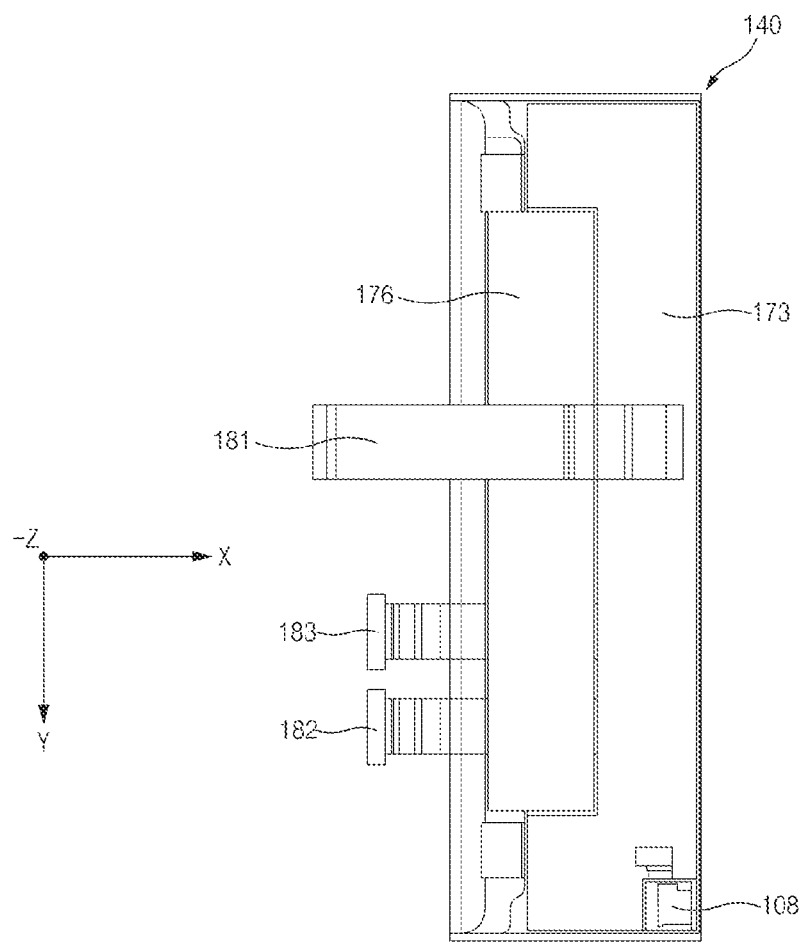
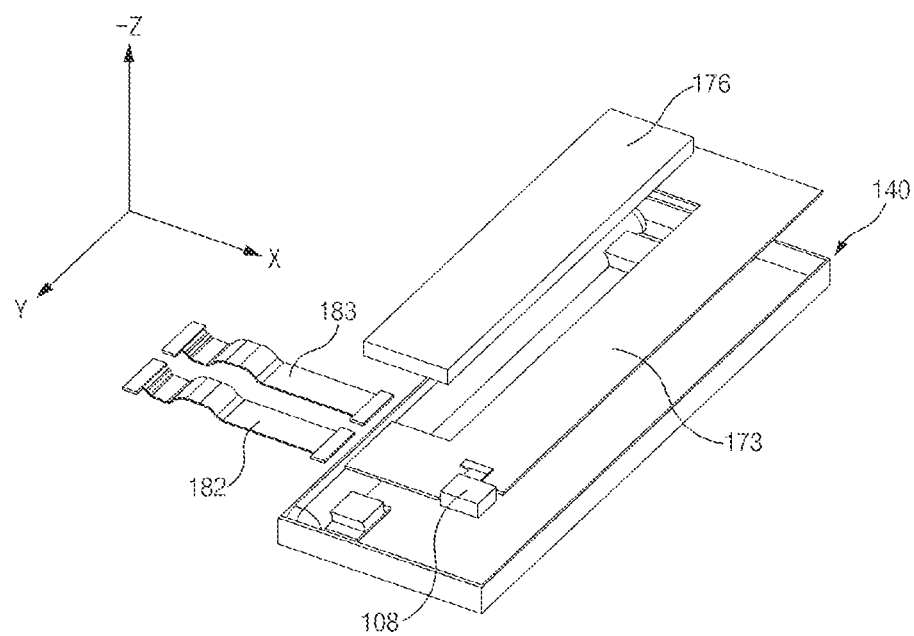
FIG.16

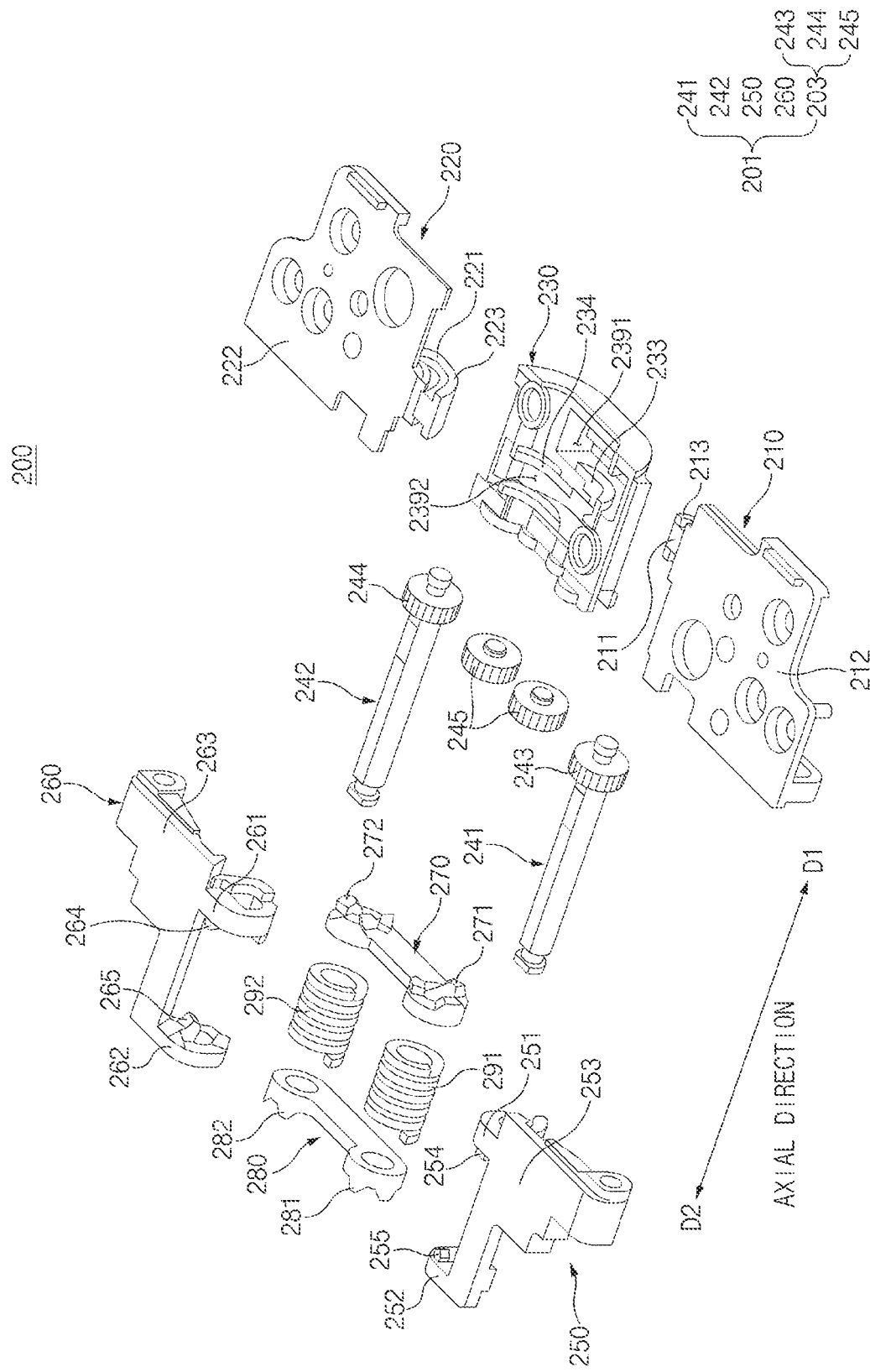

ELECTRONIC DEVICE CAPABLE OF FOLDING MOTION AND SLIDING MOTION

CROSS-REFERENCE TO RELATED APPLICATION

This application is a continuation application of International Application No. PCT/KR2021/007293 designating the United States, filed on Jun. 10, 2021 in the Korean Intellectual Property Receiving Office, claiming priority to Korean Patent Application No. 10-2020-0070411, filed Jun. 10, 2020 in the Korean Intellectual Property Office and Korean Patent Application No. 10-2021-00658736, filed May 6, 2021, in the Korean Intellectual Property Office, the disclosures of which are incorporated by reference herein in their entireties.

BACKGROUND

Field

The disclosure relates to an electronic device capable of a folding motion and a sliding motion.

Description of Related Art

With the development of display technology, an electronic device may include a flexible display that can be folded or unfolded. The electronic device may include a mechanical structure that supports deformation of the flexible display. Accordingly, the electronic device may provide a wider screen and/or a screen folded or unfolded at various angles.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device including a flexible display and capable of a sliding motion and a folding motion. Embodiments of the disclosure also provide an electronic device for providing various states by a sliding motion and a folding motion.

In accordance with an example embodiment of the disclosure, an electronic device includes: a base housing, a sliding housing at least partially overlapping the base housing and slidably coupled to the base housing, a folding housing at least partially overlapping the base housing and connected to the sliding housing, a display disposed on the folding housing and the sliding housing, at least part of the display being disposed inside the base housing, a rolling module including a bendable support coupled to a rear surface of the display and having one side connected to the sliding housing and an opposite side extending into an inner space of the base housing, and a hinge module including a hinge connected to the folding housing and the sliding housing, wherein the sliding housing is configured to rotate about a first axis of rotation and the folding housing is configured to rotate about a second axis of rotation. The electronic device is configured to be capable of performing a sliding motion in which the folding housing and the sliding housing move in a sliding direction to extend or retract a display area of the electronic device and a folding motion in which the folding housing is folded or unfolded relative to the sliding housing to fold or unfold part of the display area.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 16 is a diagram illustrating parts disposed on the folding housing of the electronic device according to various embodiments;

FIG. 18 is an exploded perspective view illustrating the hinge module of the electronic device according to various embodiments;

With regard to description of the drawings, identical or similar reference numerals may be used to refer to identical or similar components.

DETAILED DESCRIPTION

Hereinafter, various example embodiments of the disclosure may be described with reference to accompanying drawings. Accordingly, those of ordinary skill in the art will recognize that modifications, equivalents, and/or alternatives on the various example embodiments described herein can be variously made without departing from the scope and spirit of the disclosure.

Figure 1:
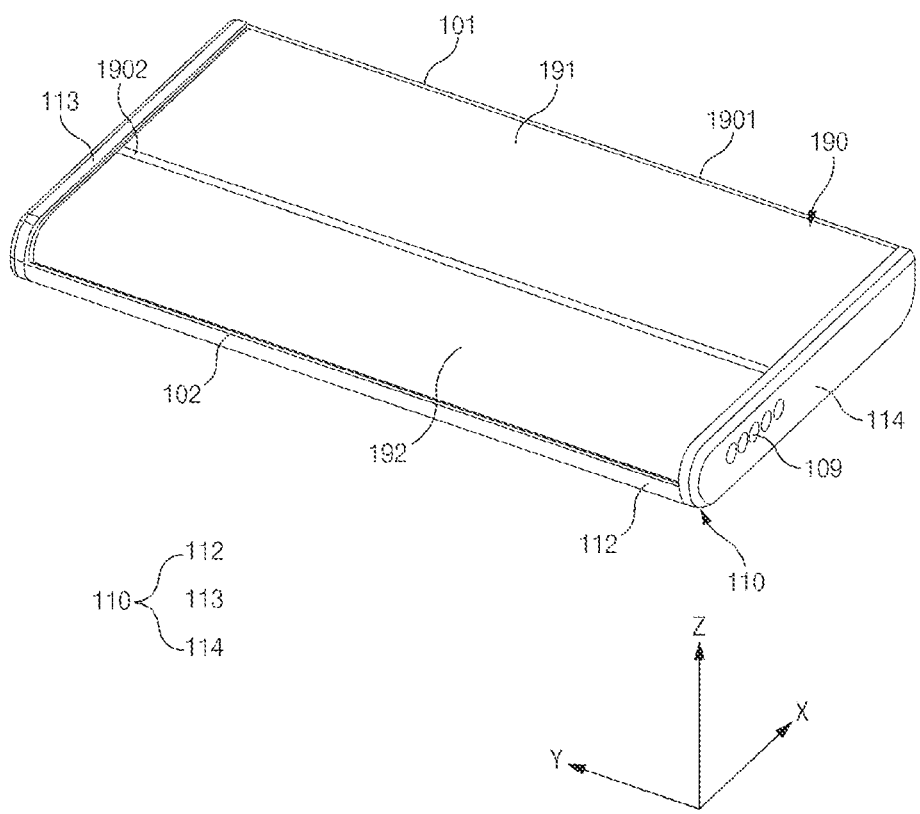
FIG. 1 is a perspective view illustrating a first state of an electronic device according to various embodiments.
Figure 2:
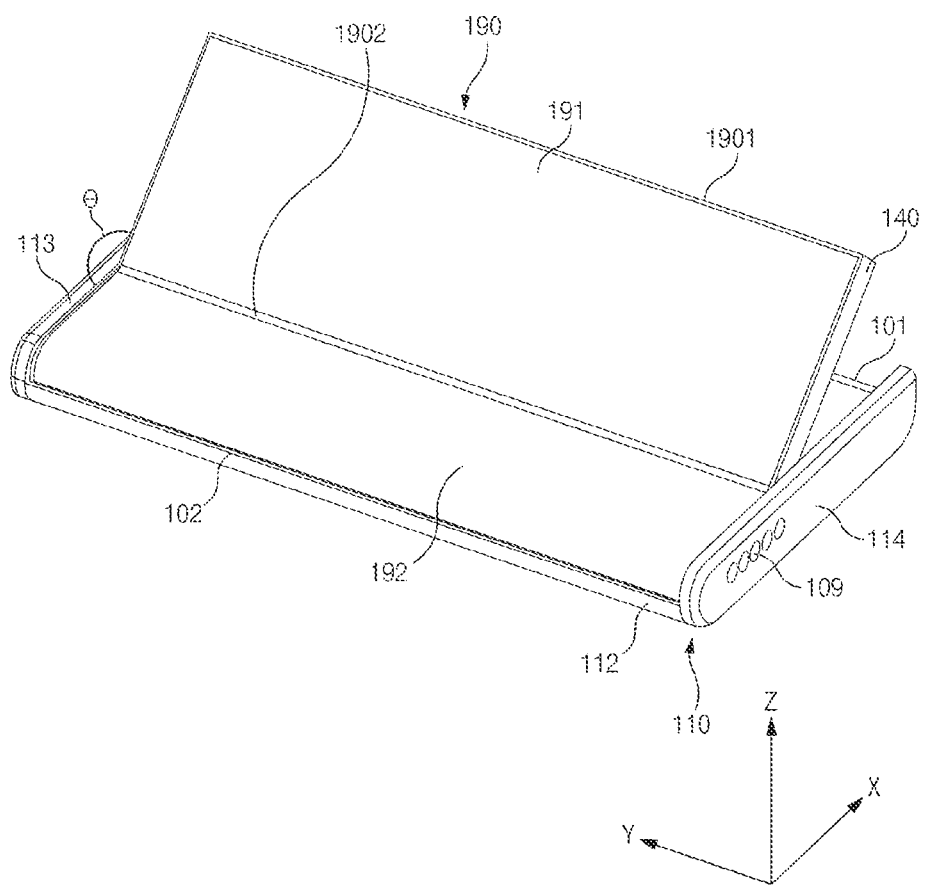
FIG. 2 is a perspective view illustrating a second state of the electronic device according to various embodiments.
Figure 3:
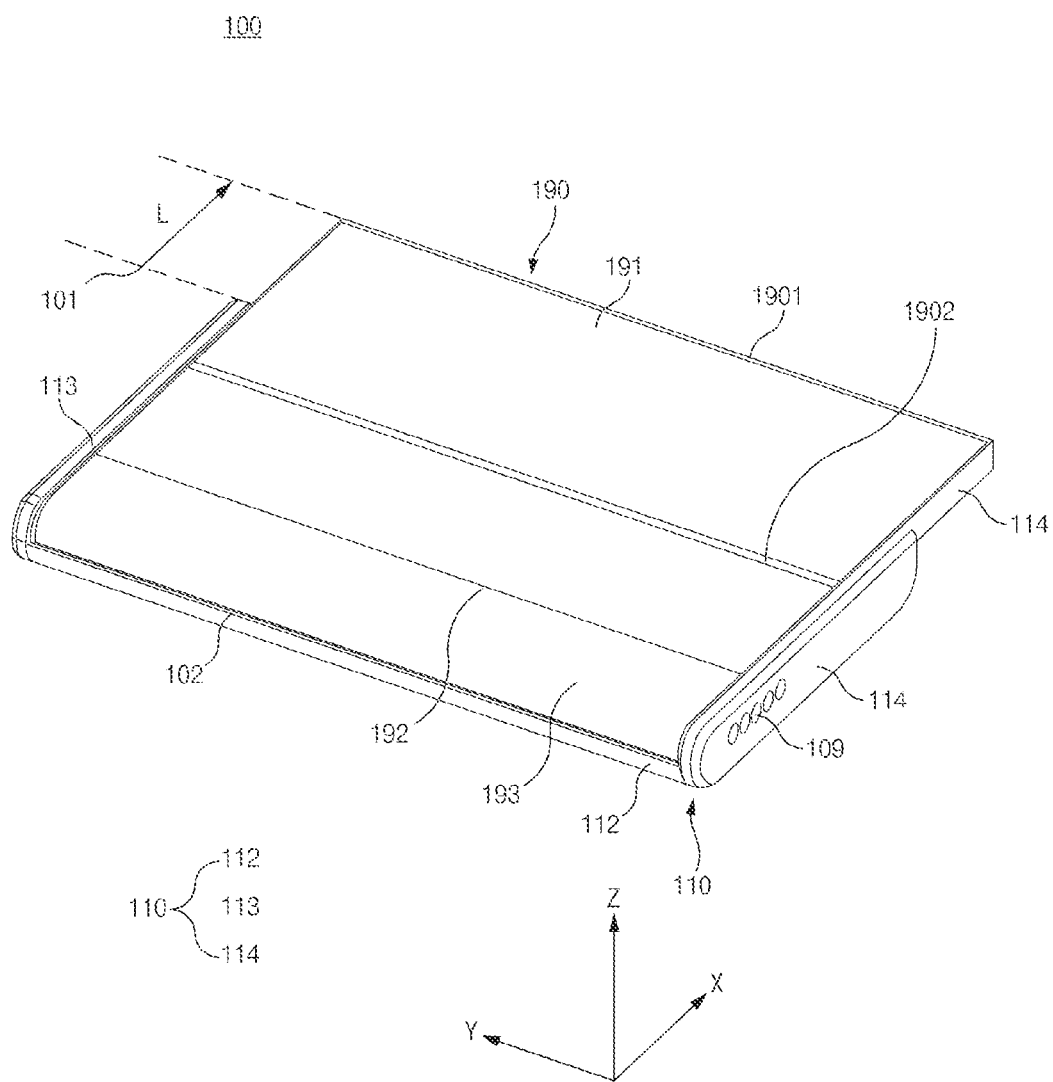
FIG. 3 is a perspective view illustrating a third state of the electronic device according to various embodiments.
Figure 4:
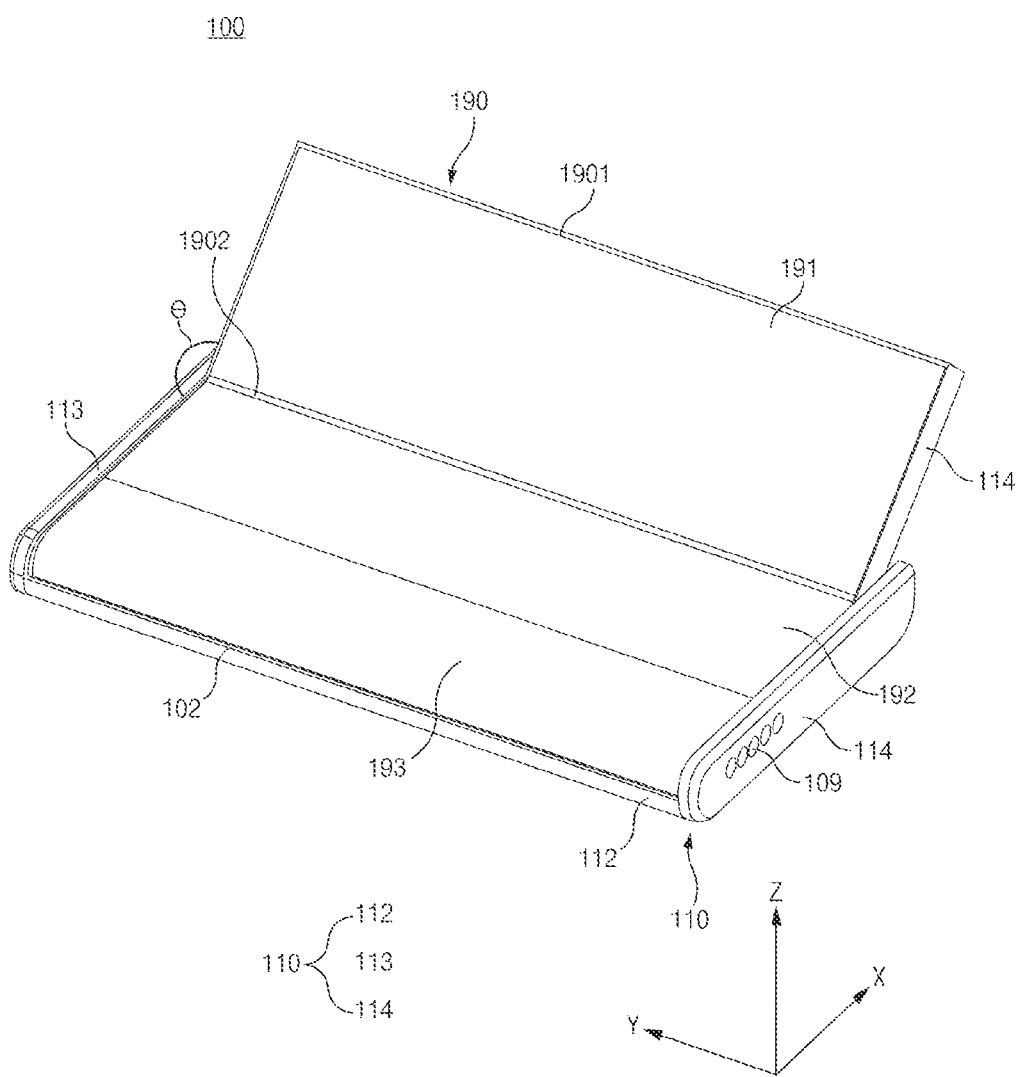
FIG. 4 is a perspective view illustrating a fourth state of the electronic device according to various embodiments.

FIG. 1 is a perspective view illustrating a first state of an electronic device according to various embodiments. FIG. 2 is a perspective view illustrating a second state of the electronic device according to various embodiments. FIG. 3 is a perspective view illustrating a third state of the electronic device according to various embodiments. FIG. 4 is a perspective view illustrating a fourth state of the electronic device according to various embodiments.

Referring to FIGS. 1 and 2, the electronic device 100 according to an embodiment may include a base housing 110, a sliding housing 130 (refer to FIG. 5), a folding housing 140 (refer to FIG. 5), and a display 190.

Hereinafter, a front side of the electronic device 100 may refer to a side that is visible when the electronic device 100 is viewed in the +Z-axis direction. For example, the front side of the electronic device 100 may include a flat portion of the display 190 and a curved portion at an edge of the flat portion.

In an embodiment, the electronic device 100 may be configured to be capable of performing a folding motion and a sliding motion. For example, the folding motion may include a folding motion and an unfolding motion, and the sliding motion may include a sliding-in motion and a sliding-out motion. For example, the electronic device 100 may include the base housing 110, the sliding housing 130 (refer to FIG. 5) slidably coupled to the base housing 110, and the folding housing 140 (refer to FIG. 5) coupled to the sliding housing 130 so as to be folded or unfolded relative to the sliding housing 130.

In an embodiment, the electronic device 100 may include the first state (e.g., FIG. 1), the second state (e.g., FIG. 2), the third state (e.g., FIG. 3), and the fourth state (e.g., FIG. 4). The electronic device 100 may be changed (or, switched) between the first state, the second state, the third state, and the fourth state by a user operation or a mechanical operation.

In an embodiment, the display 190 may include a first area 191, a second area 192, and a third area 193 (refer to FIG. 3). The shape of at least a partial area of the display 190 may be deformed depending on a state of the electronic device 100. For example, part of each of the first area 191 and the second area 192 of the display 190 may include a bending area 1902 that can be bent to be a flat surface or a curved surface.

In an embodiment, the first state may include a state in which an unfolding motion is performed from the second state or a state in which a sliding-in motion is performed from the third state. In an embodiment, in the first state, the first area 191 and at least part of the second area 192 of the display 190 may form the front side of the electronic device 100. The first area 191 of the display 190 may form a first edge 1901 of the display 190.

In various embodiments, in the first state, the first area 191 (e.g., the first edge 1901) may form a first edge 101 of the electronic device 100. For example, the first edge portion 1901 of the first area 191 may include a curved surface that is curved to form part (e.g., the first edge 101) of a side surface of the electronic device 100. In various embodiments, in the first state, the second area 192 of the display 190 may form a second edge 102 of the electronic device 100. For example, an edge portion of the second area 192 of the display 190 may be formed to be a curved surface. In an embodiment, in the first state, the portion where the first area 191 and the second area 192 are connected may be formed to be a substantially flat surface.

In an embodiment, the second state may include a state in which a folding motion is performed from the first state. For example, the second state may include a state in which the folding housing 140 is folded with a predetermined angle relative to the sliding housing 130 from the first state. In an embodiment, in the second state, the first area 191 and the second area 192 of the display 190 may be folded or bent to form a predetermined angle θ. For example, part of each of the first area 191 and the second area 192 may include the bending area 1902 that can be bent to be a flat surface or a curved surface. For example, the second area 192 may be parallel to an X-Y plane on which the electronic device 100 is placed, and the first area 191 may form a predetermined angle with respect to the X-Y plane. In an embodiment, in the first state and the second state, the third area 193 may be located inside the electronic device 100 (e.g., inside the base housing 110).

In an embodiment, the third state may include a state in which a sliding-out motion is performed from the first state. For example, the third state may include a state in which the sliding housing 130 and the folding housing 140 are slid in the X-axis direction by a predetermined distance L relative to the base housing 110 from the first state. In an embodiment, in the third state, the first area 191, the second area 192, and the third area 193 of the display 190 may form at least part of the front side of the electronic device 100. In the third state, the first area 191 may be further extended outside the base housing 110 of the electronic device 100 (e.g., in the +X-axis direction) than in the first state and the second state. The second area 192 may be formed between the first area 191 and the third area 193 and may be formed to be a substantially flat surface. In an embodiment, the first area 191 and the second area 192 may form substantially the same plane. Part of the third area 193 may move from inside the electronic device 100 to the front side of the electronic device 100 when the electronic device 100 is changed to the third state. In the third state, at least another part of the third area 193 may be located inside the electronic device 100.

In an embodiment, the fourth state may include a state in which a folding motion is performed from the third state. For example, the fourth state may include a state in which the sliding housing 130 and the folding housing 140 are slid in the X-axis direction by a predetermined distance relative to the base housing 110 from the first state and the folding housing 140 is folded with a predetermined angle relative to the sliding housing 130. In the fourth state, the first area 191 of the display 190 may extend from the second area 192 at a predetermined angle. For example, the bending area 1902 between the first area 191 and the second area 192 may be formed to be a curved surface. For example, the second area 192 may be parallel to the X-Y plane on which the electronic device 100 is placed, and the first area 191 may form a predetermined angle with respect to the X-Y plane. In an embodiment, in the first state and the second state, the third area 193 may be located inside the electronic device 100 (e.g., inside the base housing 110).

In various embodiments, a sliding motion and a folding motion of the electronic device 100 may be independently performed. For example, a sliding motion and a folding motion may be simultaneously or sequentially performed. For example, the electronic device 100 may be changed from the first state to the fourth state by performing a sliding-out motion after a folding motion, performing a folding motion after a sliding-out motion, or simultaneously performing a folding motion and a sliding-out motion.

In various embodiments, a first side cover 113 and/or a second side cover 114 of the base housing 110 may have a speaker hole 109 formed therein. The speaker hole 109 may be connected with speaker modules (e.g., a first speaker module 178 and a second speaker module 179 of FIG. 15) disposed inside the sliding housing 130.

Figure 5:
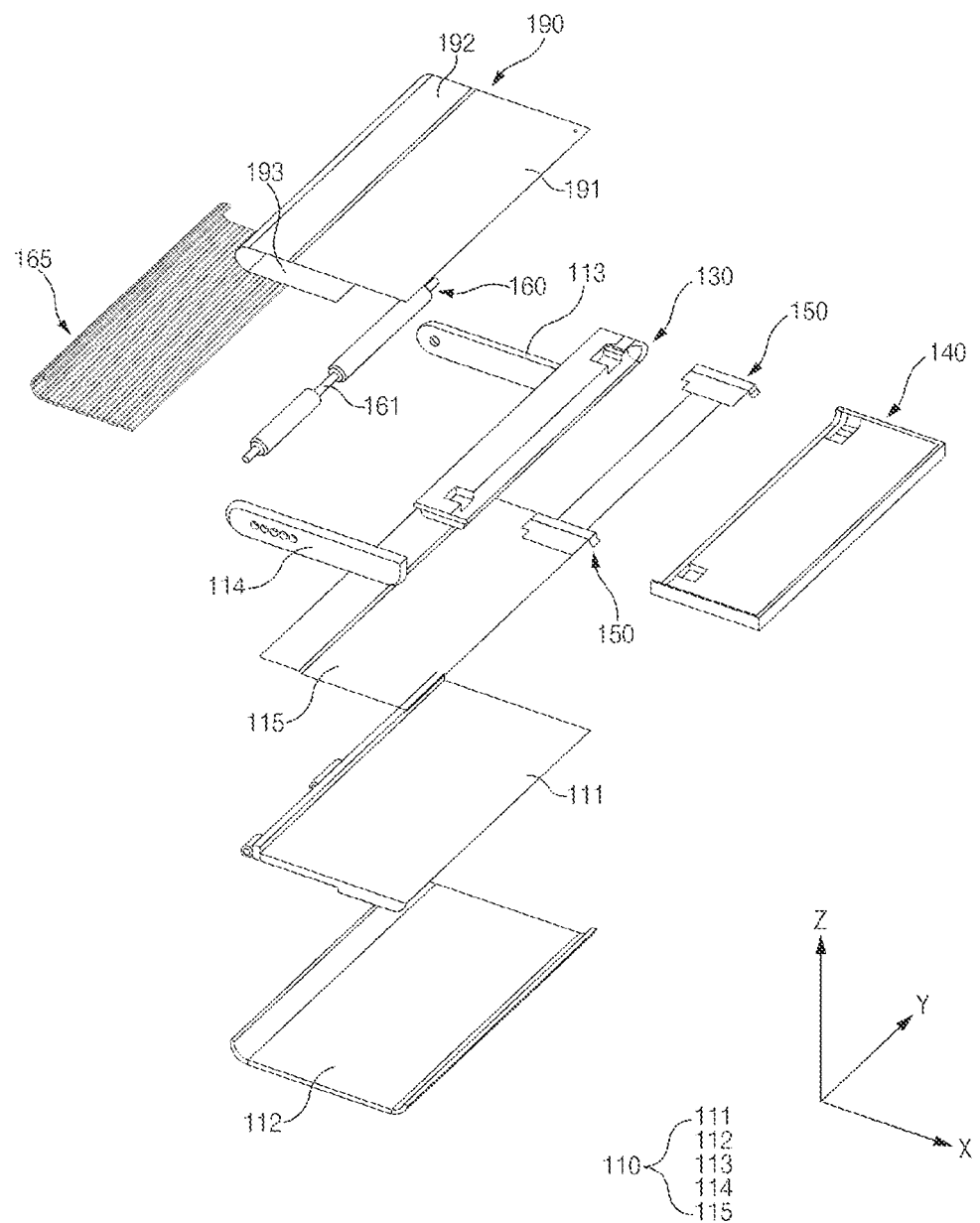
FIG. 5 is an exploded perspective view of the electronic device according to various embodiments.
Figure 6A:
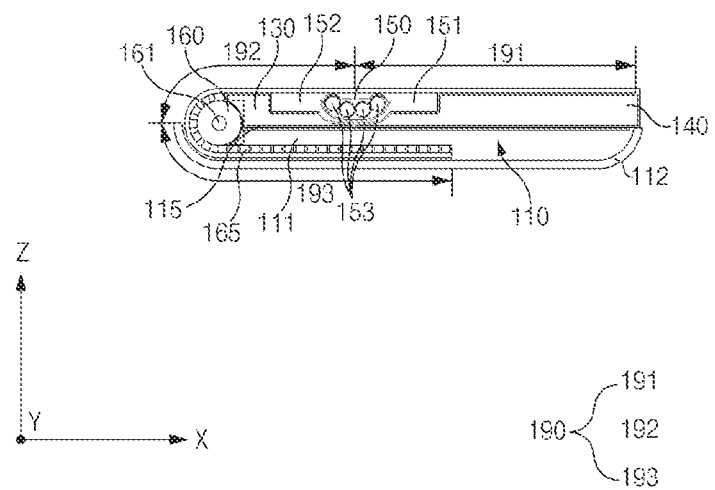
FIGS. 6A, 6B, 6C and 6D are sectional views illustrating the first state, the second state, the third state, and the fourth state, respectively, of the electronic device according to various embodiments.
Figure 6B:
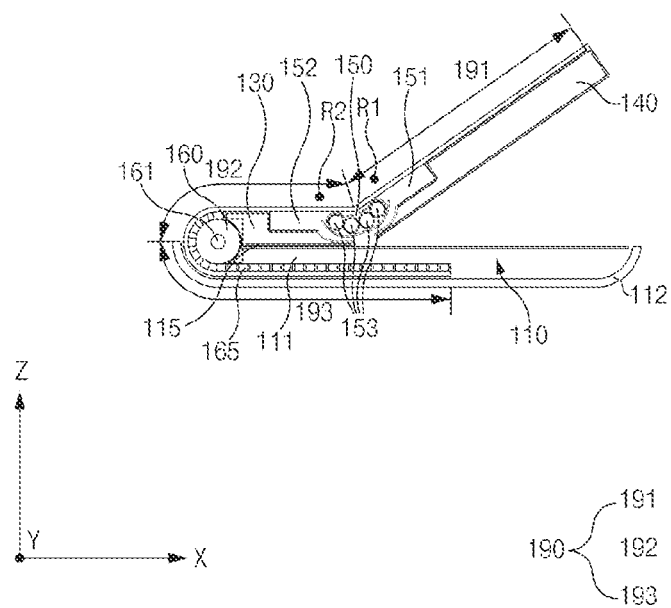
Figure 6C:
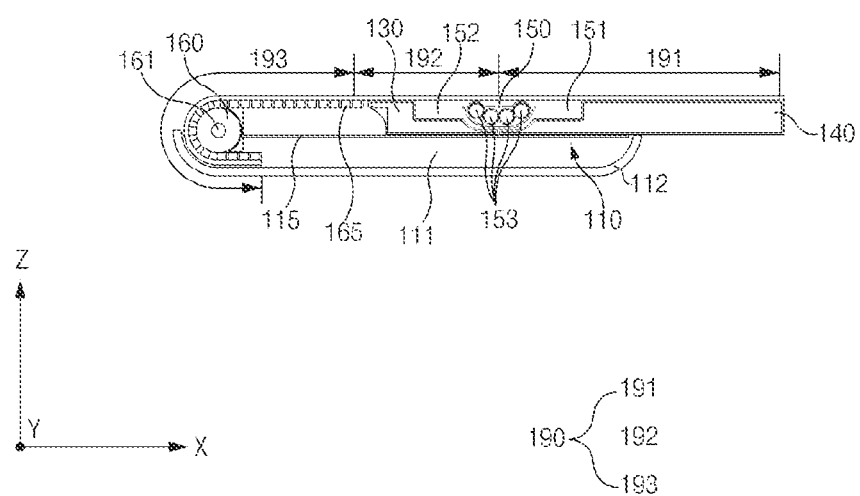
Figure 6D:
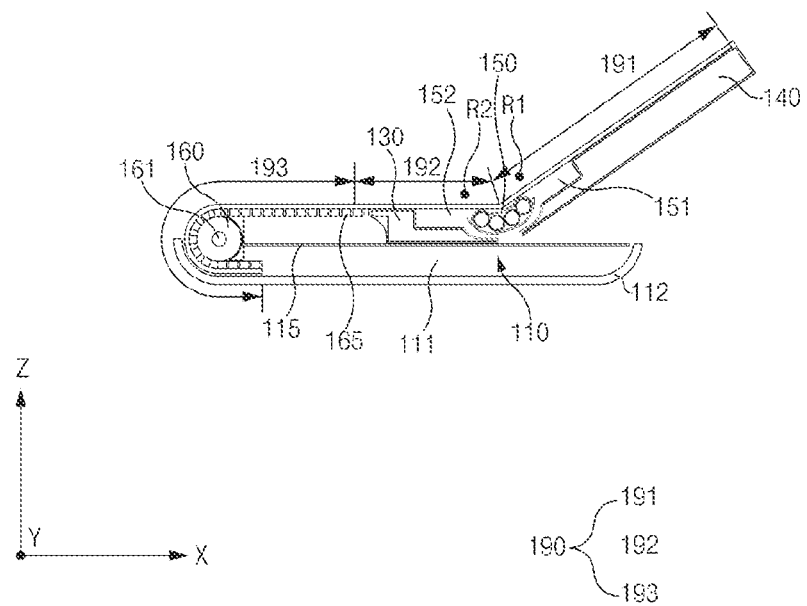

FIG. 5 is an exploded perspective view of the electronic device according to various embodiments. FIGS. 6A, 6B, 6C and 6D (which may be referred to hereinafter as FIGS. 6A to 6D) are views illustrating the first state, the second state, the third state, and the fourth state, respectively, of the electronic device according to various embodiments.

Referring to FIGS. 5 and 6A to 6D, the electronic device 100 may include the base housing 110, the sliding housing 130, the folding housing 140, the display 190, a rolling module (e.g., including a bendable support) 165, a roller 160, and hinge modules (e.g., including a hinge) 150.

In an embodiment, the base housing 110 may include a base plate 111, a first cover 112, a second cover 115, the first side cover 113, and the second side cover 114.

In an embodiment, the base housing 110 may contain fixed structures of the electronic device 100. For example, the base housing 110 may be fixed in a specified position irrespective of a change in the state of the electronic device 100. In an embodiment, the base plate 111 may be located between the first cover 112 and the second cover 115. The base plate 111 may at least partially overlap the first cover 112 and the second cover 115 in the Z-axis direction. In an embodiment, the roller 160 may be coupled to the base plate 111. For example, a shaft 161 of the roller 160 may be rotatably coupled to an edge of the base plate 111.

In an embodiment, the base plate 111 may be located between areas (e.g., the second area 192 and the third area 193) of the display 190 that face each other. In an embodiment, the base plate 111 may at least partially overlap the display 190 in the +Z-axis and −Z-axis directions. For example, in the first state, the base plate 111 may at least partially overlap the first area 191, the second area 192, and the third area 193 of the display 190 in the Z-axis direction. For example, in the third state, the base plate 111 may at least partially overlap the second area 192 and the third area 193 of the display 190 in the Z-axis direction.

In an embodiment, the first cover 112 may form a rear side of the electronic device 100. The first cover 112 may include a portion substantially parallel to the base plate 111 and curved portions formed at edges of the parallel portion. The curved portions may be formed to surround at least part of the display 190. In an embodiment, at least part of the third area 193 of the display 190 and at least part of the rolling module 165 may be located between the base plate 111 and the first cover 112. For example, when a sliding-out motion is performed, part of the display 190 and part of the rolling module 165 may be pulled from a space between the base plate 111 and the first cover 112 and may move to the front side of the electronic device 100.

In an embodiment, the first side cover 113 and the second side cover 114 may be coupled with the first cover 112 and the second cover 115 to surround a predetermined space. A space in which the base plate 111, at least part of the rolling module 165, and at least part of the display 190 are disposed may be formed in the predetermined space.

In an embodiment, the first side cover 113 and the second side cover 114 may form opposite side surfaces (e.g., a surface facing the +Y-axis direction and a surface facing the −Y-axis direction) of the electronic device 100. In an embodiment, the sliding housing 130 may be coupled to the first side cover 113 and the second side cover 114. For example, the first side cover 113 and the second side cover 114 may each include a first guide rail (e.g., a first guide rail 117 of FIG. 9A) for guiding a sliding path of the sliding housing 130 and a second guide rail (e.g., a second guide rail 119 of FIG. 8B) for guiding a path of the rolling module 165.

In an embodiment, the second cover 115 may be spaced apart from the base plate 111 at a predetermined interval.

In an embodiment, the sliding housing 130 may at least partially overlap the base plate 111 of the base housing 110 in the Z-axis direction. One side of the sliding housing 130 may be connected to the rolling module 165, and an opposite side of the sliding housing 130 may be connected to the hinge modules 150. As the sliding housing 130 is connected to the rolling module 165, the rolling module 165 may be pressed or pulled in the X-axis direction when the sliding housing 130 moves. As the sliding housing 130 is connected to the hinge modules 150, the sliding housing 130 may slide together with the folding housing 140 when a sliding motion is performed. In an embodiment, in response to a movement of the folding housing 140, the sliding housing 130 may form the same plane with the folding housing 140, or may form a predetermined angle with the folding housing 140.

In an embodiment, the sliding housing 130 may slide in the +X-axis direction away from the roller 160 or in the −X-axis direction toward the roller 160. In an embodiment, the sliding direction of the sliding housing 130 may be guided by the first guide rails (e.g., the first guide rails 117 of FIG. 9A) that are formed on the first side cover 113 and the second side cover 114. For example, referring to FIG. 9A, the sliding housing 130 may have, on opposite side surfaces thereof, guide portions (e.g., guide portions 138 of FIG. 9A) that are at least partially accommodated in the first guide rails 117.

In an embodiment, the folding housing 140 may be connected to the sliding housing 130 through the hinge modules 150. The folding housing 140 may be folded or unfolded relative to the sliding housing 130. For example, the folding housing 140 may form the same plane with the sliding housing 130, or may form an inclined surface having a predetermined angle with respect to the sliding housing 130. The folding housing 140 may at least partially overlap the base plate 111 of the base housing 110 in the Z-axis direction. In an embodiment, when the sliding housing 130 slides, the folding housing 140 may slide together with the sliding housing 130 in the +X-axis or −X-axis direction.

In an embodiment, the rolling module 165 may be configured to support a rear surface of the display 190. The rolling module 165 may include a plurality of bars that extend in the Y-axis direction and that are connected together so as to be bendable, thereby forming a bendable support. In an embodiment, the rolling module 165 may be disposed such that at least part thereof surrounds the roller 160. Part of the rolling module 165 may be located inside the base housing 110, and another part of the rolling module 165 may extend to one side of the sliding housing 130 along an outer surface of the roller 160.

In an embodiment, the roller 160 may be coupled to the base plate 111. The shaft 161 of the roller 160 may be rotatably coupled to an edge of the base plate 111. The shaft 161 of the roller 161 may extend in a direction perpendicular to the sliding direction. The roller 160 may be at least partially surrounded by the rolling module 165. The roller 160 may guide the rolling module 165 to allow the rolling module 165 and the display 190 to smoothly move when the sliding housing 130 and the folding housing 140 slide.

Referring to FIGS. 6A to 6D, each of the hinge modules 150 may include a second rotary member 152 coupled to the sliding housing 130 and a first rotary member 151 coupled to the folding housing 140. The first rotary member 151 may be configured to rotate about a first axis of rotation R1, and the second rotary member 152 may be configured to rotate about a second axis of rotation R2. The first axis of rotation R1 and the second axis of rotation R2 may be parallel to each other. In various embodiments, the first axis of rotation R1 and the second axis of rotation R2 may be perpendicular to the sliding direction. The first axis of rotation R1 and the second axis of rotation R2 may be parallel to the direction in which the shaft 161 of the roller 160 extends. In various embodiments, the first rotary member 151 and the second rotary member 152 of the hinge module 150 may operate in conjunction with each other so as to rotate through the same angle in opposite directions. For example, the hinge module 150 may include a gear structure 153.

In an embodiment, the hinge module 150 may slide together with the sliding housing 130 and the folding housing 140 during a sliding motion. The hinge module 150 may be configured such that during a folding motion, the first rotary member 151 and the second rotary member 152 rotate to allow the sliding housing 130 and the folding housing 140 to be folded or unfolded.

Hereinafter, arrangements of the structures and the display 190 depending on states of the electronic device 100 will be described with reference to FIGS. 6A to 6D.

In the first state (refer to FIG. 6A), the first area 191 and the second area 192 of the display 190 may form the front side of the electronic device 100. The first area 191 of the display 190 may be disposed on the folding housing 140, and the second area 192 of the display 190 may be disposed on the sliding housing 130. At least part of the third area 193 of the display 190 may be located inside the base housing 110. For example, the third area 193 of the display 190 may be disposed between the base plate 111 and the first cover 112. The rolling module 165 may support the rear surfaces of the third area 193 and part of the second area 192 of the display 190. At least part of the rolling module 165, together with the third area 193 of the display 190, may be located between the base plate 111 and the first cover 112. The rolling module 165 may extend from the sliding housing 130 into the space between the base plate 111 and the first cover 112. At least part of the rolling module 165 may surround the roller 160. In the first state, the base housing 110 may overlap the sliding housing 130 and the folding housing 140 when viewed in the Z-axis direction. The sliding housing 130 may at least partially make contact with the second cover 115 of the base housing 110.

In the second state (refer to FIG. 6B), the first area 191 of the display 190 may obliquely extend from the second area 192. The folding housing 140 having the first area 191 disposed thereon and the sliding housing 130 having the second area 192 disposed thereon may be disposed to form a predetermined angle therebetween through the hinge modules 150. At least part of the third area 193 of the display 190 may be located inside the base housing 110. For example, the third area 193 of the display 190 may be disposed between the base plate 111 and the first cover 112. The rolling module 165 may support the rear surfaces of the third area 193 and part of the second area 192 of the display 190. At least part of the rolling module 165, together with the third area 193 of the display 190, may be located between the base plate 111 and the first cover 112. The rolling module 165 may extend from the sliding housing 130 into the space between the base plate 111 and the first cover 112. At least part of the rolling module 165 may surround the roller 160. In the second state, the base housing 110 may overlap the sliding housing 130 when viewed in the Z-axis direction. The sliding housing 130 may at least partially make contact with the second cover 115 of the base housing 110. In the second state, the folding housing 140 and the first area 191 of the display 190 may be inclined with respect to the base plate 111 of the base housing 110.

When the electronic device 100 is changed from the first state to the second state, the folding housing 140 and the sliding housing 130 may rotate about the axes of rotation R1 and R2, respectively. For example, the folding housing 140 and the sliding housing 130 may operate in conjunction with each other so as to rotate through the same angle in opposite directions.

In the third state (refer to FIG. 6C), at least part of the third area 193 of the display 190 may form the front side of the electronic device 100. For example, part of the third area 193, together with part of the rolling module 165 that supports the part of the third area 193, may be located above the base plate 111 in the +Z-axis direction. Another part of the third area 193 of the display 190 may be located inside the base housing 110. For example, the other part of the third area 193, together with part of the rolling module 165, may be disposed between the base plate 111 and the first cover 112. The third area 193 of the display 190, together with the first area 191 and the second area 192, may form the front side of the electronic device 100 and may form substantially the same plane. In an embodiment, the base housing 110 may overlap the sliding housing 130 and/or the folding housing 140 when viewed in the Z-axis direction.

When the electronic device 100 is changed from the first state to the third state, the sliding housing 130 may slide (e.g., slide out) in the X-axis direction. The rolling module 165 connected to the sliding housing 130 may be pulled from the inner space of the base housing 110. As the rolling module 165 moves, the third area 193 may move to the front side of the electronic device 100. For example, one portion of the rolling module 165 may move in the +X-axis direction together with the sliding housing 130, another portion of the rolling module 165 may move in the −X-axis direction inside the base housing 110, and the other portion of the rolling module 165 may rotate while making contact with the roller 160. The roller 160 may rotate in the clockwise direction with respect to the drawings. In various embodiments, the rolling module 165 may move along the second guide rails 119 that are formed on the first side cover 113 and the second side cover 114. The second guide rails 119 may include a straight section and a curved section surrounding the roller 160. The second guide rails 119, together with the roller 160, may guide a movement of the rolling module 165.

In the fourth state (refer to FIG. 6D), the first area 191 of the display 190 may obliquely extend from the second area 192. The folding housing 140 having the first area 191 disposed thereon and the sliding housing 130 having the second area 192 disposed thereon may be disposed to form a predetermined angle therebetween through the hinge modules 150. Part of the third area 193 of the display 190 may be located inside the base housing 110, and another part of the third area 193 may be disposed to form the front side of the electronic device 100 together with the first area 191 and the second area 192. For example, the first area 191 of the display 190 may be folded with a predetermined angle relative to the second area 192 and part of the third area 193. In the fourth state, the base housing 110 may overlap the sliding housing 130 when viewed in the Z-axis direction. The sliding housing 130 may at least partially make contact with the second cover 115 of the base housing 110. In the fourth state, the folding housing 140 and the first area 191 of the display 190 may be inclined with respect to the base plate 111 of the base housing 110.

When the electronic device 100 is changed from the second state to the fourth state, the sliding housing 130 may move in the X-axis direction, and the rolling module 165 connected to the sliding housing 130 may be pulled in the X-axis direction. As the rolling module 165 moves, the third area 193 may move to the front side of the electronic device 100. For example, one portion of the rolling module 165 may move in the +X-axis direction together with the sliding housing 130, another portion of the rolling module 165 may move in the −X-axis direction inside the base housing 110, and the other portion of the rolling module 165 may rotate while making contact with the roller 160. At least part of the rolling module 165 may surround the roller 160, and the roller 160 may rotate in the clockwise direction with respect to the drawings. In various embodiments, the rolling module 165 may move along the second guide rails 119 that are formed on the first side cover 113 and the second side cover 114. The second guide rails 119 may include the straight section and the curved section surrounding the roller 160. The second guide rails 119, together with the roller 160, may guide a movement of the rolling module 165.

When the electronic device 100 is changed from the third state to the fourth state, the folding housing 140 and the sliding housing 130 may rotate about the axes of rotation R1 and R2, respectively. For example, the folding housing 140 and the sliding housing 130 may operate in conjunction with each other so as to rotate through the same angle in opposite directions.

Figure 7A:
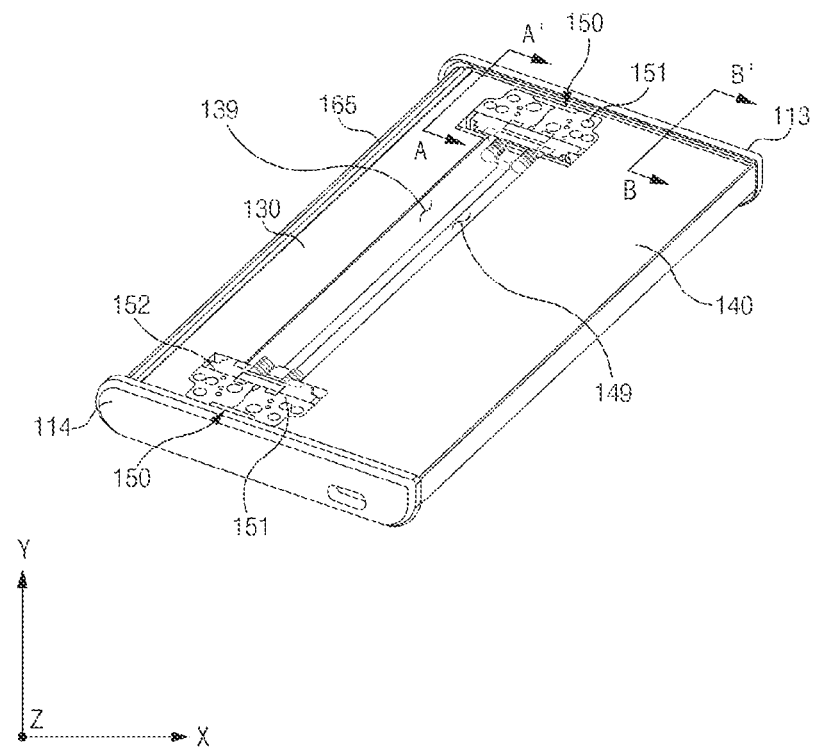
FIGS. 7A and 7B are diagrams illustrating an example internal structure of the electronic device in the first state according to various embodiments.
Figure 7B:
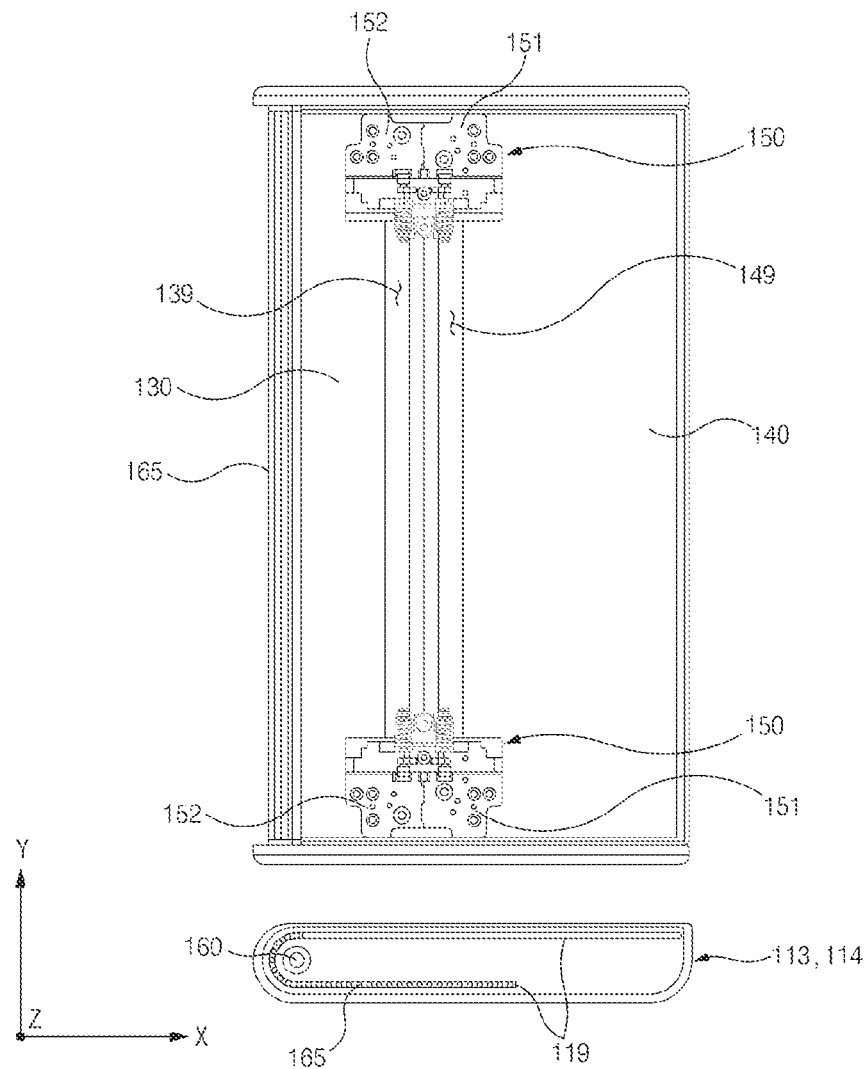
Figure 8A:
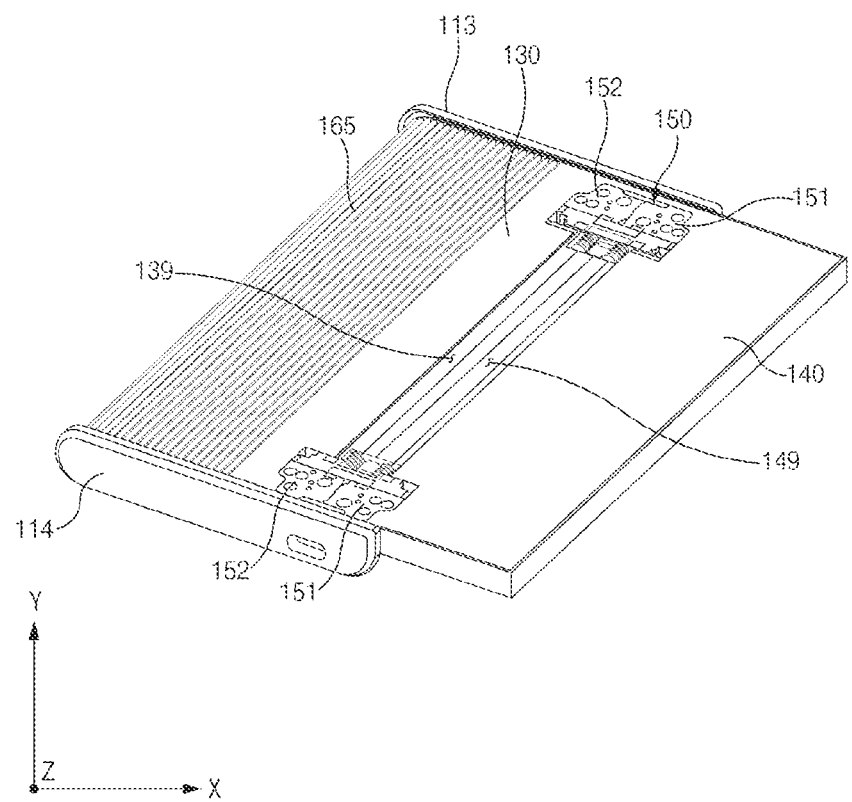
FIGS. 8A and 8B are diagrams illustrating an example internal structure of the electronic device in the third state according to various embodiments.
Figure 8B:
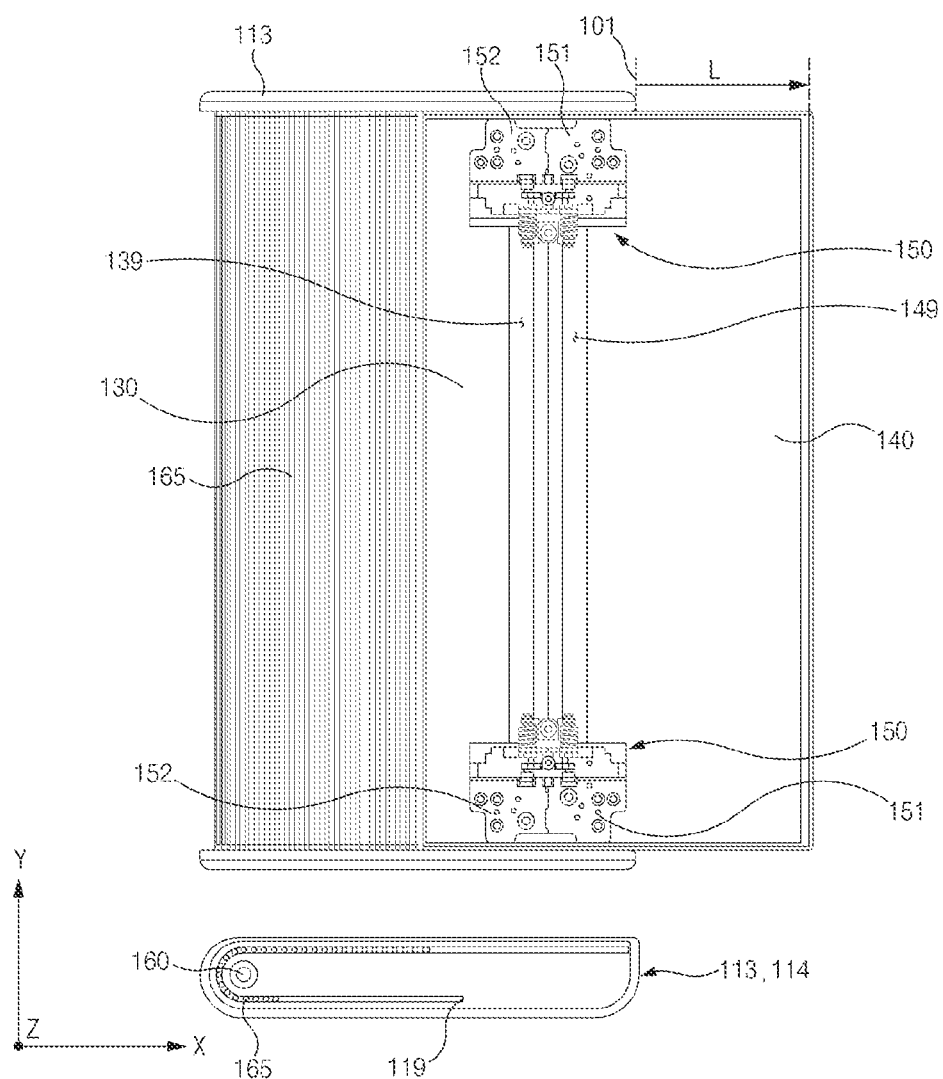

FIGS. 7A and 7B are diagrams illustrating an example internal structure of the electronic device in the first state according to various embodiments. FIGS. 8A and 8B are diagrams illustrating an example internal structure of the electronic device in the third state according to various embodiments.

Referring to FIGS. 7A, 7B, 8A, and 8B, the sliding housing 130 and the folding housing 140 may be connected by the hinge modules 150. Each of the hinge modules 150 may include the first rotary member 151 connected to the folding housing 140 and the second rotary member 152 connected to the sliding housing 130.

In an embodiment, the first rotary member 151 may rotate about the first axis of rotation R1, and the second rotary member 152 may rotate about the second axis of rotation R2.

The first axis of rotation R1 and the second axis of rotation R2 may be parallel to the Y-axis. The first axis of rotation R1 and the second axis of rotation R2 may be formed in positions spaced apart from a display (e.g., the display 190 of FIGS. 6A to 6D) in the Z-axis direction.

In an embodiment, the sliding housing 130 may include a first recess 139 formed on a portion thereof that is adjacent to the folding housing 140. The first recess 139 may extend in the Y-axis direction. At least part of the hinge module 150 may be disposed in the first recess 139. The folding housing 140 may include a second recess 149 formed on a portion thereof that is adjacent to the sliding housing 130. The second recess 149 may extend in the Y-axis direction. At least part of the hinge module 150 may be disposed in the second recess 149. The first recess 139 and the second recess 149 may form substantially one space. Part of the display (e.g., the display 190 of FIGS. 6A to 6D) may be accommodated in the space. For example, a bending area (e.g., the bending area 1902 of FIGS. 6A to 6D) of the display may be accommodated in the space.

When the electronic device 100 is changed from the first state illustrated in FIGS. 7A and 7B to the third state illustrated in FIGS. 8A and 8B, the sliding housing 130 may slide in the X-axis direction. The rolling module 165 may be pulled by the sliding housing 130. Accordingly, part of the rolling module 165 may be pulled in the X-axis direction, and another part of the rolling module 165 that is located inside the base housing 110 may be pulled in the −X-axis direction.

When the electronic device 100 is changed from the third state illustrated in FIGS. 8A and 8B to the first state illustrated in FIGS. 7A and 7B, the sliding housing 130 may slide in the −X-axis direction. The sliding housing 130 may press the rolling module 165 in the −X-axis direction. Accordingly, part of the rolling module 165 may move in the −X-axis direction, and another part of the rolling module 165 that is located inside the base housing 110 may move in the X-axis direction.

Figure 9A:
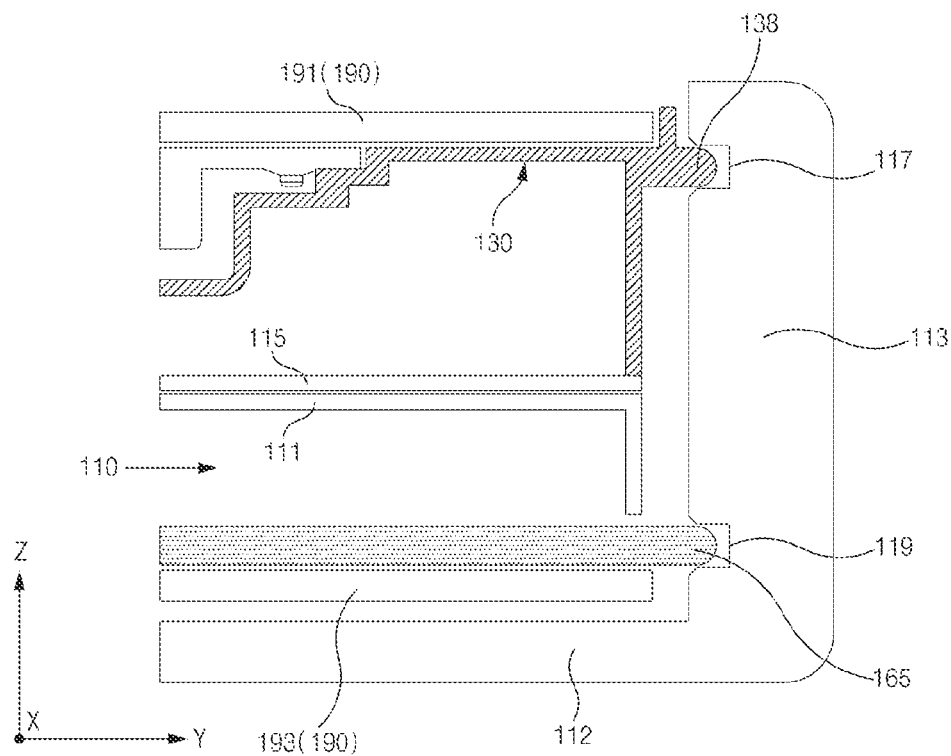
FIGS. 9A and 9B are diagrams illustrating a sliding housing, a folding housing, and a base housing of the electronic device according to various embodiments.
Figure 9B:
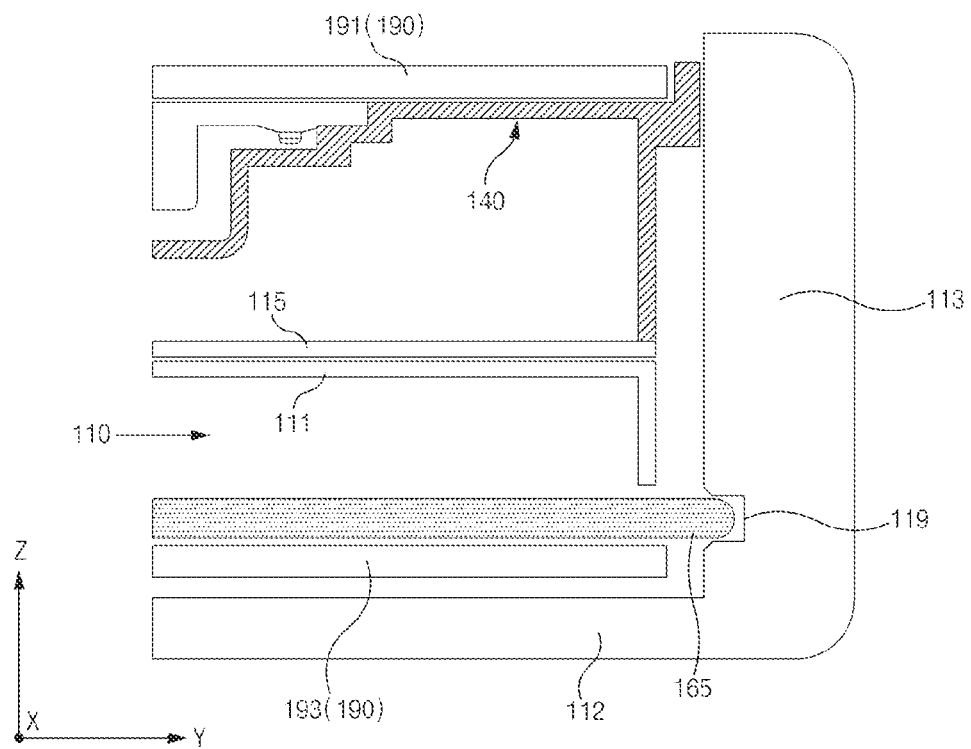

FIGS. 9A and 9B are diagrams illustrating the sliding housing, the folding housing, and the base housing of the electronic device according to various embodiments. For example, FIG. 9A is a sectional view taken along line A-A' of FIG. 7A, and FIG. 9B is a sectional view taken along line B-B' of FIG. 7A.

Referring to FIG. 9A, the side covers 113 and 114 of the base housing 110 may each include the second guide rail 119 for guiding the rolling module 165 and the first guide rail 117 for guiding the sliding housing 130.

In an embodiment, the guide portions 138 of the sliding housing 130 may be accommodated in the first guide rails 117. For example, the guide portions 138 of the sliding housing 130 may include a portion protruding in the Y-axis direction and a portion protruding in the −Y-axis direction.

In an embodiment, the sliding housing 130 may move in the X-axis direction as a user pushes the display 190 or the folding housing 140 in the X-axis direction or pulls the folding housing 140 in the X-axis direction. At this time, the sliding housing 130 may move in the state in which the guide portions 138 are accommodated in the first guide rails 117.

In an embodiment, the first guide rails 117 may extend in the X-axis direction to guide the sliding direction of the sliding housing 130. In various embodiments, the first guide rails 117 may extend to a range in which the sliding housing 130 is able to slide. For example, referring to FIG. 9A, the first guide rails 117 may not be formed in positions corresponding to the folding housing 140. In another embodiment, the first guide rails 117 may extend from areas with which the sliding housing 130 makes contact to areas with which the folding housing 140 makes contact. However, the folding housing 140 may not include portions accommodated in the first guide rails 117.

Referring to FIG. 9B, the side covers 113 and 114 of the base housing 110 may each include the second guide rail 119 for guiding the rolling module 165.

In an embodiment, the second guide rails 119 may extend to a range in which the rolling module 165 is able to move. For example, the second guide rails 119 may extend from areas of the side covers 113 and 114 with which the sliding housing 130 makes contact to areas of the side covers 113 and 114 with which the folding housing 140 makes contact. In an embodiment, the second guide rails 119 may be formed in a shape corresponding to the path of the rolling module 165. For example, the second guide rails 119 may each include a straight section and a curved section.

In an embodiment, at least some of the plurality of bars included in the rolling module 165 may be accommodated in the second guide rails 119. For example, the plurality of bars may extend in the Y-axis direction, and end portions of the plurality of bars may be at least partially accommodated in the second guide rails 119.

Referring to FIG. 9B, the first guide rails 117 may not be coupled with the folding housing 140. For example, the first guide rails 117 may not be formed on the areas with which the folding housing 140 makes contact and may extend only to the areas with which the sliding housing 130 makes contact. Even in a case where the first guide rails 117 extend to the areas with which the folding housing 140 makes contact, the folding housing 140 may not include protruding portions accommodated in the first guide rails 117.

In an embodiment, when the electronic device 100 is changed from the first state to the third state or the fourth state, the folding housing 140 may slide together with the sliding housing 130. In this case, the sliding of the folding housing 140 may be guided by the sliding housing 130. For example, when the electronic device 100 is changed from the first state to the third state, the folding housing 140 may move in the X-axis direction as the guide portions 138 of the sliding housing 130 are accommodated in the first guide rails 117. For example, when the electronic device 100 is changed from the first state to the fourth state, the folding housing 140 may move in the X-axis direction in the state of being folded with a predetermined angle relative to the sliding housing 130.

In various embodiments, a guide structure for guiding the sliding housing 130 and/or the rolling module 165 is not limited to that illustrated in the drawings. For example, the guide structure may include first guide rails formed on the sliding housing 130 and guide portions formed on the side covers 113 and 114.

Figure 10A:
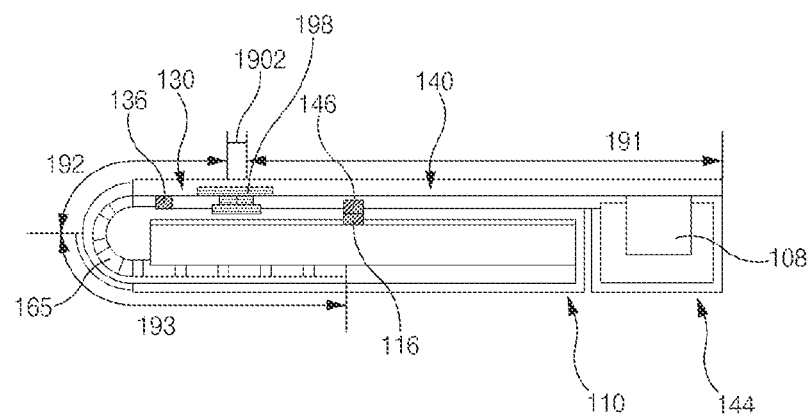
FIGS. 10A and 10B are sectional views illustrating an example sensor structure for detecting a state of the electronic device according to various embodiments.
Figure 10B:
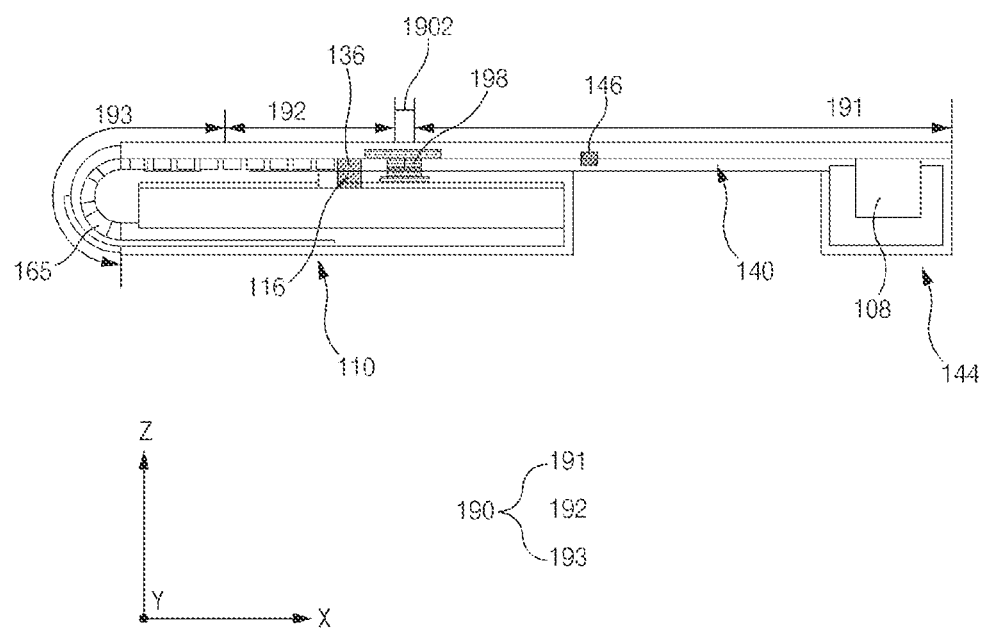
Figure 11A:
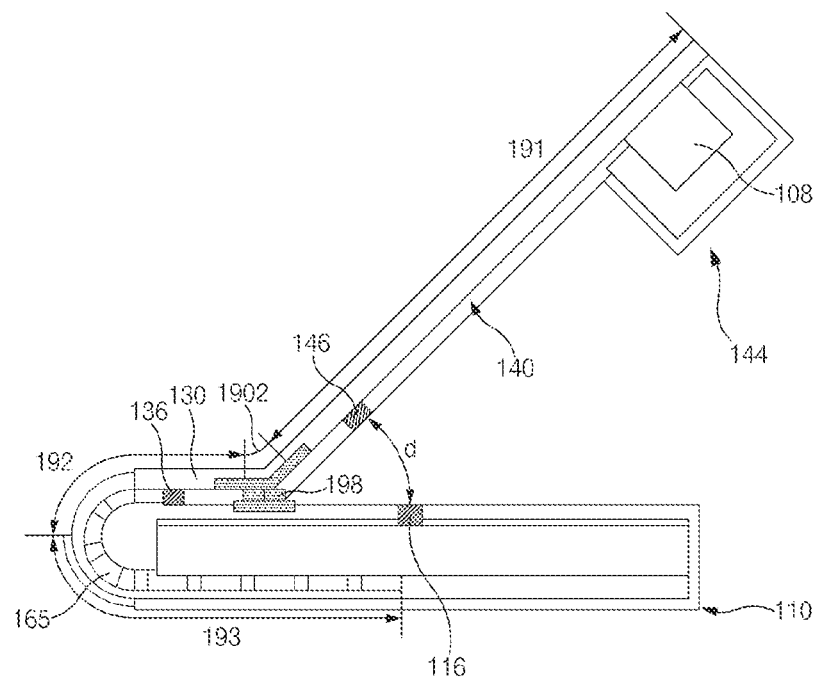
FIGS. 11A and 11B are sectional views illustrating an example sensor structure for detecting a state of the electronic device according to various embodiments.
Figure 11B:
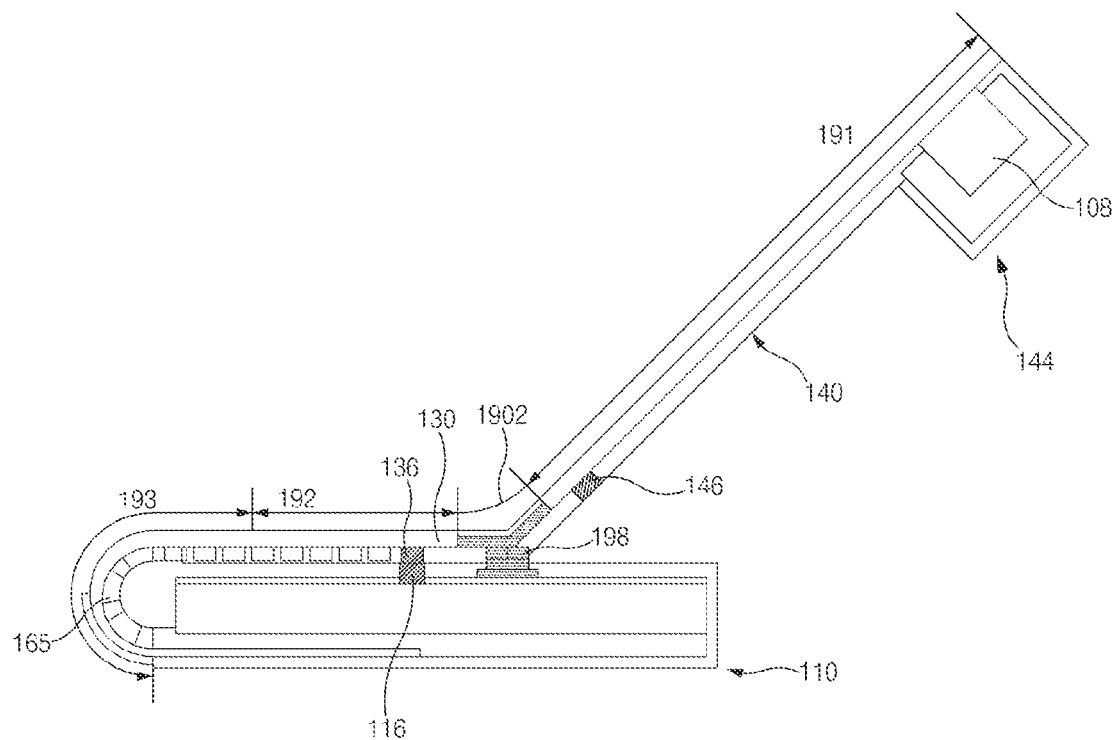

FIGS. 10A and 10B are sectional views illustrating an example sensor structure for detecting a state of the electronic device according to various embodiments. FIGS. 11A and 11B are sectional views illustrating a sensor structure for detecting a state of the electronic device according to various embodiments.

FIG. 10A is a sectional view illustrating the first state of the electronic device 100. FIG. 10B is a sectional view illustrating the third state of the electronic device 100. FIG. 11A is a sectional view illustrating the second state of the electronic device 100. FIG. 11B is a sectional view illustrating the fourth state of the electronic device 100.

Referring to FIGS. 10A, 10B, 11A, and 11B, a sliding-in state may include the first state and the second state. In an embodiment, a sliding-out state may include the third state and the fourth state.

Figure 22:
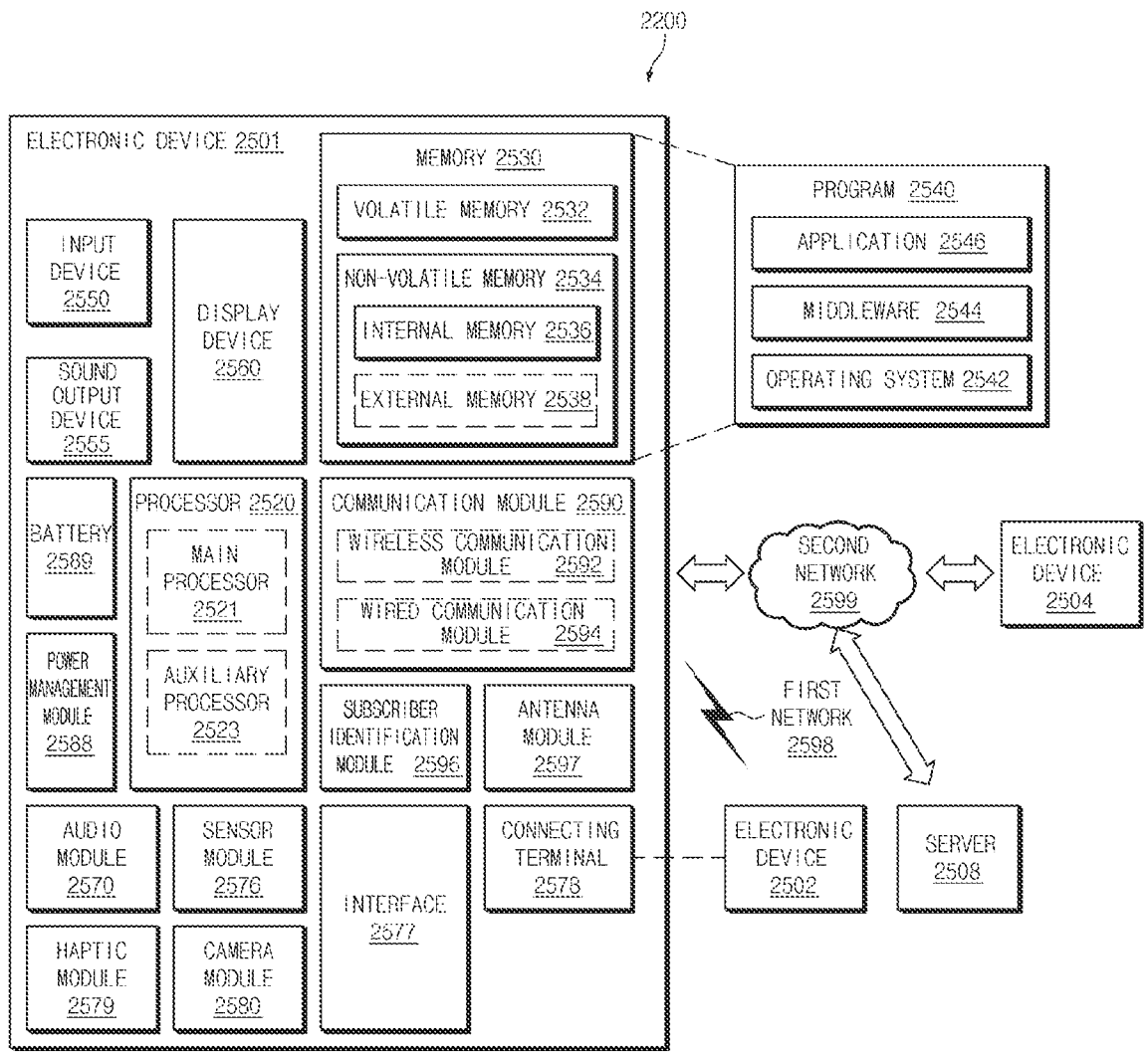
FIG. 22 is a block diagram illustrating an example electronic device in a network environment according to various embodiments.

In an embodiment, the electronic device 100 may include a processor (e.g., a processor 2220 of FIG. 22). The processor 2220 may detect and/or determine a state of the electronic device 100 using at least one of a first sensor 136, a second sensor 146, a third sensor 116, and/or a fourth sensor 198.

Referring to FIGS. 10A and 10B, the folding housing 140 of the electronic device 100 may further include an extending portion 144 disposed adjacent to a side surface of the base housing 110 in the first state. In the first state, the extending portion 144, together with the base housing 110, may form the rear side of the electronic device 100. In various embodiments, a front camera module 108 may be disposed in the extending portion 144. In an embodiment, when the electronic device 100 performs a sliding-in motion from the third state to the first state, the folding housing 140 may move until the extending portion 144 makes contact with the base housing 110.

Referring to FIGS. 10A, 10B, 11A, and 11B, the electronic device 100 may include the first sensor 136, the second sensor 146, and the third sensor 116 that are related to a sliding motion. For example, based on a signal sensed by at least one of the first sensor 136, the second sensor 146, or the third sensor 116, the electronic device 100 may determine whether the electronic device 100 is in a sliding-in state or a sliding-out state.

In an embodiment, the third sensor 116 may be disposed on the base housing 110, and the first sensor 136 and the second sensor 146 may be disposed on a structure that moves during a sliding motion. For example, the first sensor 136 and the second sensor 146 may be disposed on the sliding housing 130 and/or the folding housing 140. For example, referring to the drawings, the first sensor 136 may be disposed on the sliding housing 130, and the second sensor 146 may be disposed on the folding housing 140.

In an embodiment, the third sensor 116 may be configured to interact with the first sensor 136 and/or the second sensor 146. For example, referring to FIGS. 10A and 11A, the third sensor 116 may be disposed to face the second sensor 146 in a sliding-in state (e.g., the first state of FIG. 1 or the second state of FIG. 2). For example, in the sliding-in state, the third sensor 116 may at least partially overlap the second sensor 146 when viewed in the Z-axis direction. In an embodiment, as the electronic device 100 performs a sliding-in motion, the third sensor 116 may make contact with the second sensor 146 or may be close to the second sensor 146 within a specified range, and the processor 2220 may detect whether the electronic device 100 is in a sliding-in state, based on a signal sensed by the third sensor 116.

For example, referring to FIGS. 10B and 11B, the third sensor 116 may be disposed to face the first sensor 136 in a sliding-out state (e.g., the third state of FIG. 3 or the fourth state of FIG. 4). For example, in the sliding-out state, the third sensor 116 may at least partially overlap the first sensor 136 when viewed in the Z-axis direction. In an embodiment, as the electronic device 100 performs a sliding-out motion, the third sensor 116 may make contact with the first sensor 136 or may be close to the first sensor 136 within a specified range, and the processor 2220 may detect whether the electronic device 100 is in a sliding-out state, based on a signal sensed by the third sensor 116.

In an embodiment, the third sensor 116 may be configured to detect the distance between the third sensor 116 and each of the first sensor 136 and the second sensor 146 and detect whether the third sensor 116 makes contact with each of the first sensor 136 and the second sensor 146. For example, the third sensor 116 may include a Hall sensor capable of sensing a magnetic field. For example, the first sensor 136 and the second sensor 146 may each include a coil and/or a magnet.

In various embodiments, the processor 2220 may determine whether a sliding motion is performed at present, in addition to whether the electronic device 100 is in a sliding-in/out state. For example, the first sensor 136 may include, for example, a first Hall sensor, the second sensor 146 may include, for example, a second Hall sensor, and the third sensor 116 may include, for example, a magnet and/or a coil. In this case, the processor 2220 may detect whether a sliding-in motion is performed and whether a sliding-out motion is performed, based on a first signal sensed by the first Hall sensor and a second signal sensed by the second Hall sensor. For example, when the first signal sensed by the first Hall sensor decreases and the second signal sensed by the second Hall sensor increases, the processor 2220 may determine that a sliding-out motion is performed. For example, when the first signal sensed by the first Hall sensor increases and the second signal sensed by the second Hall sensor decreases, the processor 2220 may determine that a sliding-in motion is performed. Furthermore, when a signal sensed by the second Hall sensor is measured in a specified range, the processor 2220 may determine that the electronic device 100 is in a sliding-out state, and when a signal sensed by the first Hall sensor is measured in a specified range, the processor 2220 may determine that the electronic device 100 is in a sliding-in state.

In various embodiments, the electronic device 100 may be configured such that each of the first sensor 136 and the second sensor 146 includes a magnet and/or a coil and the third sensor 116 includes a Hall sensor.

In an embodiment, the first sensor 136 may be electrically connected to a second circuit board (e.g., a second circuit board 172 of FIG. 15) that is disposed inside the sliding housing 130. The second sensor 146 may be electrically connected to a third circuit board (e.g., a third circuit board 173 of FIG. 16) that is disposed inside the folding housing 140. The third sensor 116 may be electrically connected to a first circuit board (e.g., a first circuit board 171 of FIG. 14) that is disposed inside the base housing 110.

Referring to FIGS. 11A and 11B, the electronic device 100 may include the fourth sensor 198 related to a folding motion. For example, based on a signal sensed by the fourth sensor 198, the electronic device 100 may determine whether the electronic device 100 is in a folded state or a flat state.

In an embodiment, the fourth sensor 198 may be disposed on the display 190. For example, the fourth sensor 198 may be at least partially located inside the display 190, or may be at least partially disposed on the rear surface of the display 190. In various embodiments, the fourth sensor 198 may be formed in a thin film form. For example, the fourth sensor 198 may include a thin film sensor for sensing pressure.

In various embodiments, the fourth sensor 198 may include a sensor located on a first rotary member (e.g., the first rotary member 151 of FIGS. 8A and 8B) of a hinge module (e.g., the hinge module 150 of FIGS. 8A and 8B) and a sensor located on a second rotary member (e.g., the second rotary member 152 of FIGS. 8A and 8B) of the hinge module (e.g., the hinge module 150 of FIGS. 8A and 8B). For example, the sensor 4a may include, for example, a magnet and/or a coil that forms a magnetic field, and the sensor 4b may include, for example, a Hall sensor that senses the magnetic field. For example, the sensor 4b may include a magnet and/or a coil that forms a magnetic field, and the sensor 4a may include a Hall sensor that senses the magnetic field.

Referring to FIGS. 10A, 10B, 11A, and 11B, the fourth sensor 198 may be disposed to at least partially overlap the bending area 1902 of the display 190. For example, at least part of the fourth sensor 198 may be formed to be folded or unfolded together with the bending area 1902.

In various embodiments, the fourth sensor 198 may extend such that at least part thereof is formed on the sliding housing 130 and the other part is formed on the folding housing 140. In this case, when a folding motion is performed, the length of the fourth sensor 198 may increase or decrease. For example, when the bending area 1902 is folded, the length of the fourth sensor 198 may increase, and the resistance value of a conductive pattern included in the fourth sensor 198 may increase. For example, the resistance value may increase as the display 190 is further folded. The current flowing through the conductive pattern may decrease due to the increased resistance. The processor 2220 may be configured to detect whether the electronic device 100 is in a folded state or a flat state, based on the current or a change in the current.

In various embodiments, the processor 2220 may be configured to detect whether the electronic device 100 is in a folded state or a flat state, based on at least one of the second sensor 146 or the third sensor 116. For example, referring to FIG. 11A, the electronic device 100 may be configured to detect whether the electronic device 100 is in the first state or the second state, based on a change in the distance d between the first sensor 136 disposed on the sliding housing 130 and the third sensor 116 disposed on the base housing 110. As the distance increases, the magnitude of a magnetic field measured by the third sensor 116 may decrease.

In various embodiments, the electronic device 100 may detect whether the display 190 is in a flat state (e.g., the first state of FIG. 10A or the third state of FIG. 10B), based on the fourth sensor 198. The electronic device 100 may detect whether the electronic device 100 is in the first state or the third state, by comparing a first distance between the third sensor 116 and the first sensor 136 and a second distance between the third sensor 116 and the second sensor 146. For example, when the first distance is measured to be greater than the second distance, the electronic device 100 may determine that the electronic device 100 is in the first state. For example, when the first distance is measured to be smaller than the second distance, the electronic device 100 may determine that the electronic device 100 is in the third state. As the distance increases, the magnitude of a magnetic field measured by the third sensor 116 may decrease.

In various embodiments, the electronic device 100 may detect whether the display 190 is in a folded state (e.g., the second state of FIG. 11A or the fourth state of FIG. 11B), based on the fourth sensor 198. The electronic device 100 may detect whether the electronic device 100 is in the second state or the fourth state, based on the first distance between the third sensor 116 and the first sensor 136 and the second distance between the third sensor 116 and the second sensor 146. For example, when the first distance is measured to be smaller than the second distance or when the first sensor 136 and the third sensor 116 make contact with each other, the electronic device 100 may determine that the electronic device 100 is in the fourth state. For example, when the third sensor 116 is spaced apart from the first sensor 136 and the second sensor 146 by more than a specified distance, the electronic device 100 may determine that the electronic device 100 is in the second state. As the distance increases, the magnitude of a magnetic field measured by the third sensor 116 may decrease.

In various embodiments, the electronic device 100 determined to be in a folded state may be determined to be in the fourth state, when the third sensor 116 and the first sensor 136 make contact with each other. Based on the distance d between the third sensor 116 and the second sensor 146, whether the electronic device 100 is in the second state or the fourth state may be determined.

Figure 12A:
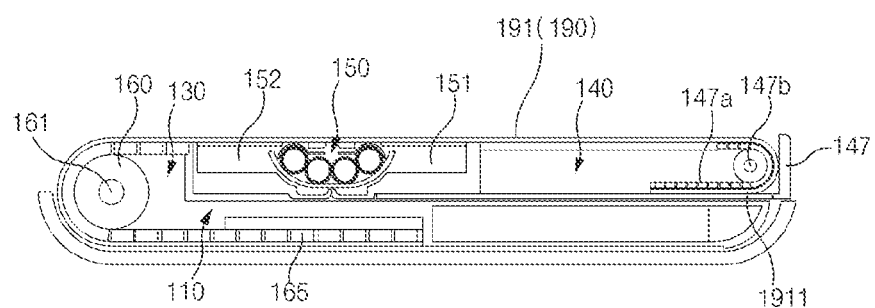
FIGS. 12A, 12B and 12C are sectional views illustrating a sliding motion and a folding motion of the electronic device according to various embodiments.
Figure 12B:
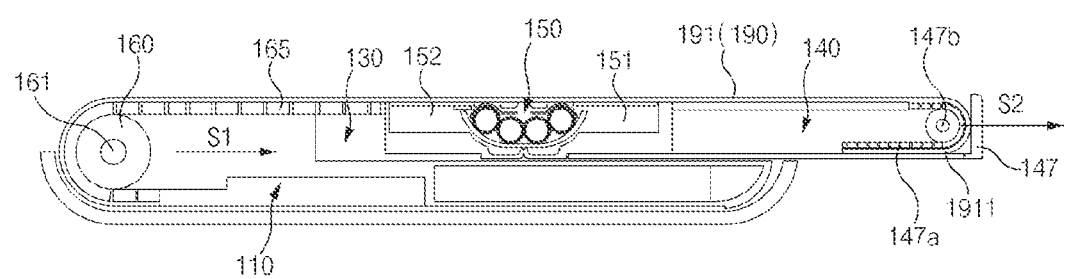
Figure 12C:
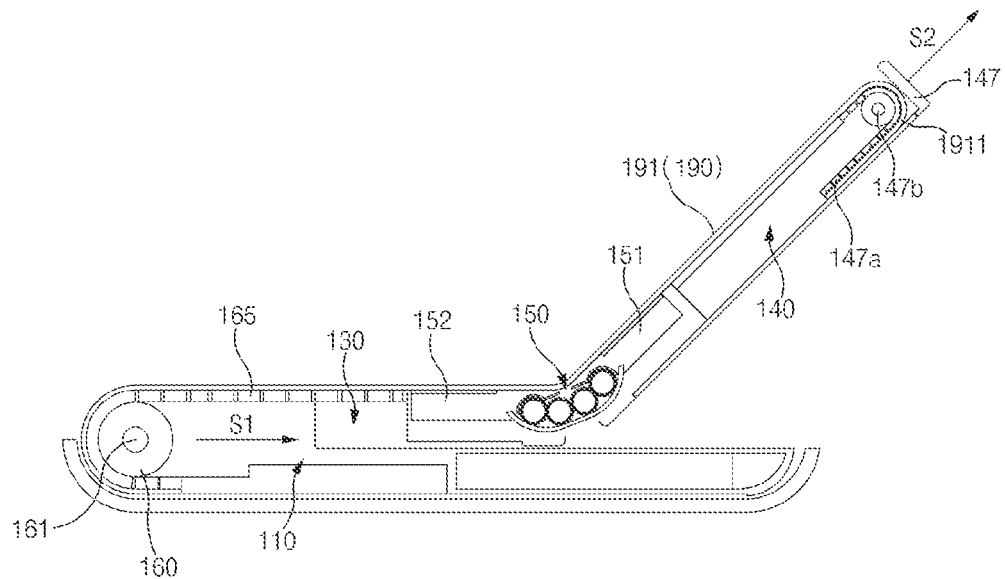

FIGS. 12A, 12B and 12C are sectional views illustrating a sliding motion and a folding motion of the electronic device according to various embodiments.

Referring to FIGS. 12A, 12B and 12C (which may be referred to hereinafter as FIGS. 12A to 12C), the electronic device 100 may be configured to be capable of performing a first sliding motion S1, a second sliding motion S2, and a folding motion. The first sliding motion S1 and the folding motion are the same as or similar to those described above with reference to FIGS. 1 to 11B. Therefore, descriptions thereof may not be repeated here.

In an embodiment, the folding housing 140 may further include a second sliding housing 147. At least part of the second sliding housing 147 may be located inside the folding housing 140. The second sliding housing 147 may be slidably coupled to the folding housing 140. For example, the second sliding housing 147 may move such that at least part thereof further extends outside the folding housing 140 when the second sliding motion S2 is performed.

In an embodiment, the first area 191 of the display 190 may further include an additional extension area 1911. The additional extension area 1911 may be disposed inside the second sliding housing 147, or may be moved to the front side of the electronic device 100 by a second rolling module 147a when the second sliding motion S2 is performed.

In an embodiment, the second sliding housing 147 may include a second roller 147b and the second rolling module 147a. The second roller 147b may be rotatably coupled to the second sliding housing 147. The second roller 147b may move together with the second sliding housing 147 when the second sliding motion S2 is performed. The second roller 147b may be at least partially surrounded by the second rolling module 147a.

In an embodiment, the second rolling module 147a may support the rear surface of the first area 191 of the display 190. For example, the second rolling module 147a may be formed to surround the second roller 147b. At least part of the second rolling module 147a may be located inside the second sliding housing 147. When the second sliding motion S2 is performed, part of the second rolling module 147a located inside the second sliding housing 147 may move to a surface of the second sliding housing 147 along the second roller 147b. At this time, the additional extension area 1911 of the display 190 coupled to the second rolling module 147a may move to the surface of the second sliding housing 147 together with the second rolling module 147a, and the additional extension area 1911 of the display 190 may form part of the front side of the electronic device 100.

In an embodiment, the second sliding motion S2 may be performed independently of the first sliding motion S1 and the folding motion.

Figure 13:
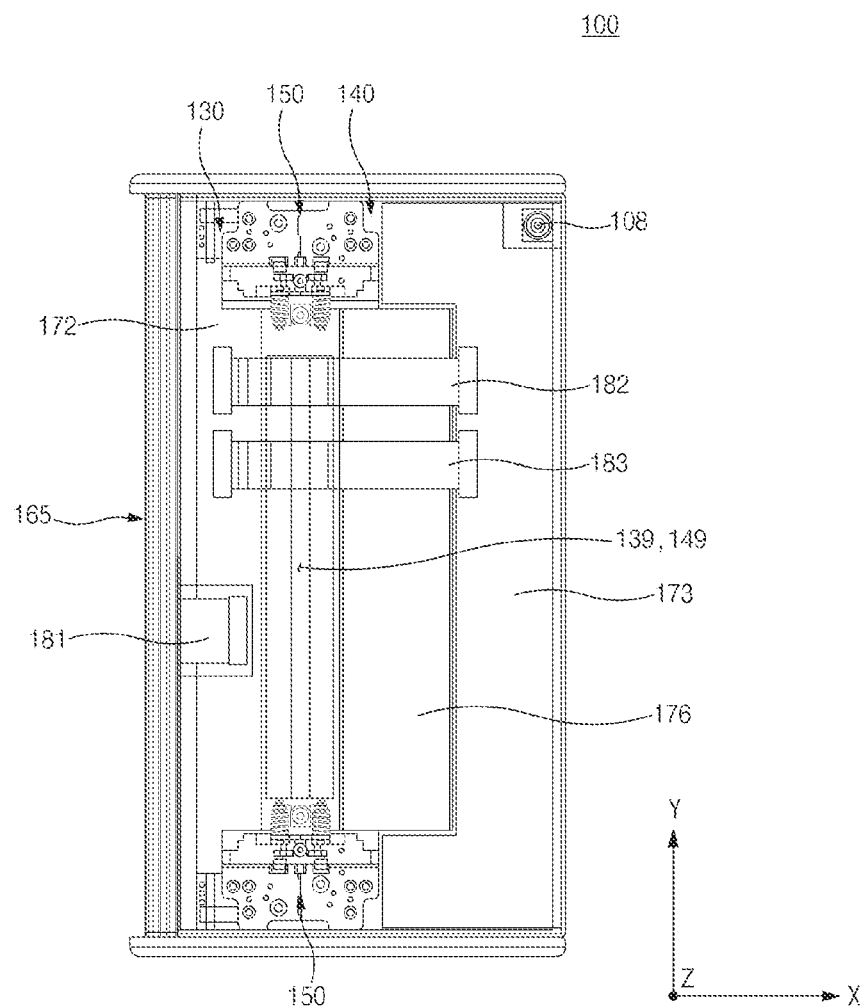
FIG. 13 is a diagram illustrating an example arrangement of parts of the electronic device according to various embodiments.
Figure 14:
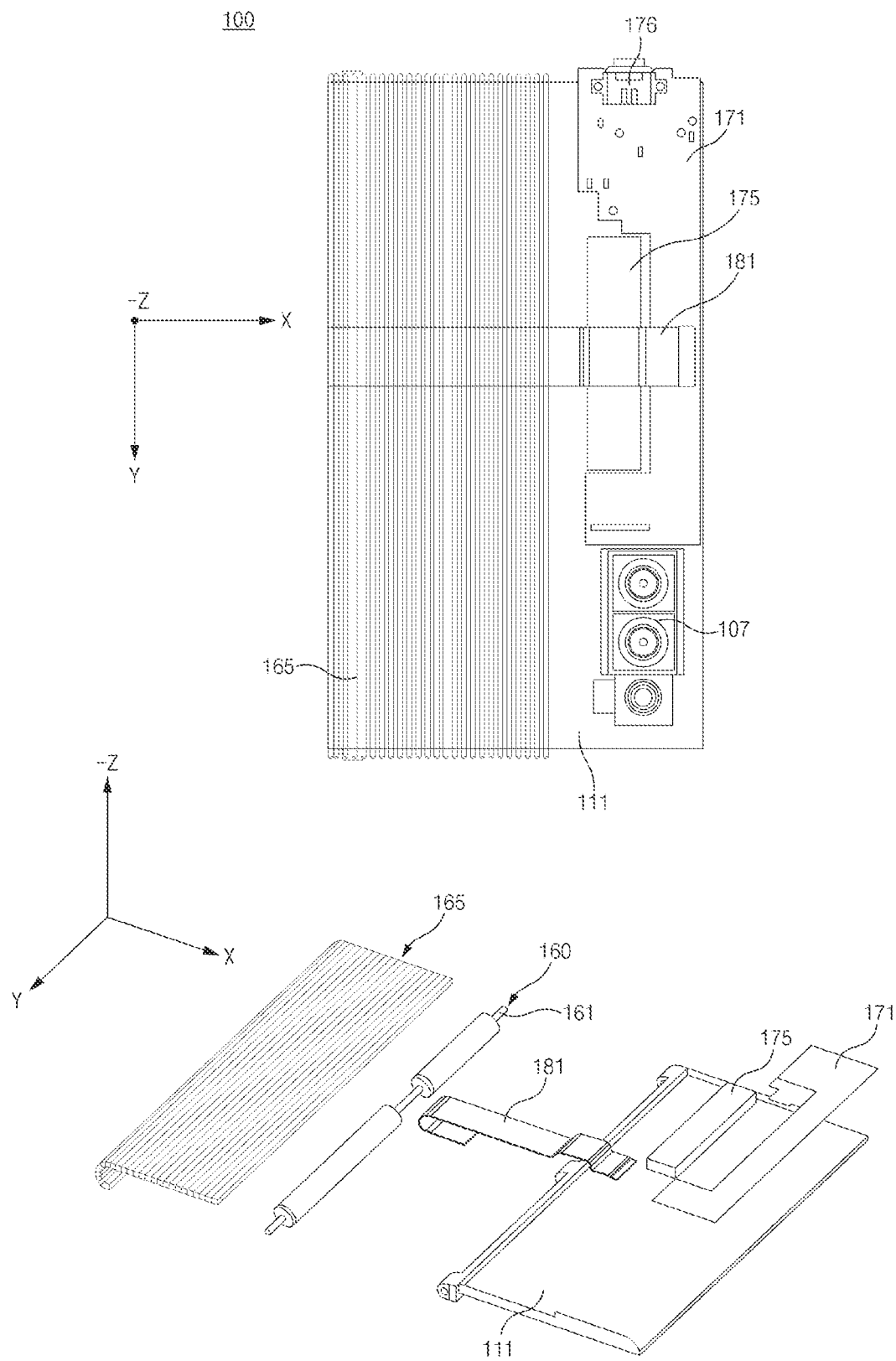
FIG. 14 is a diagram illustrating parts disposed on the base housing of the electronic device according to various embodiments.
Figure 15:
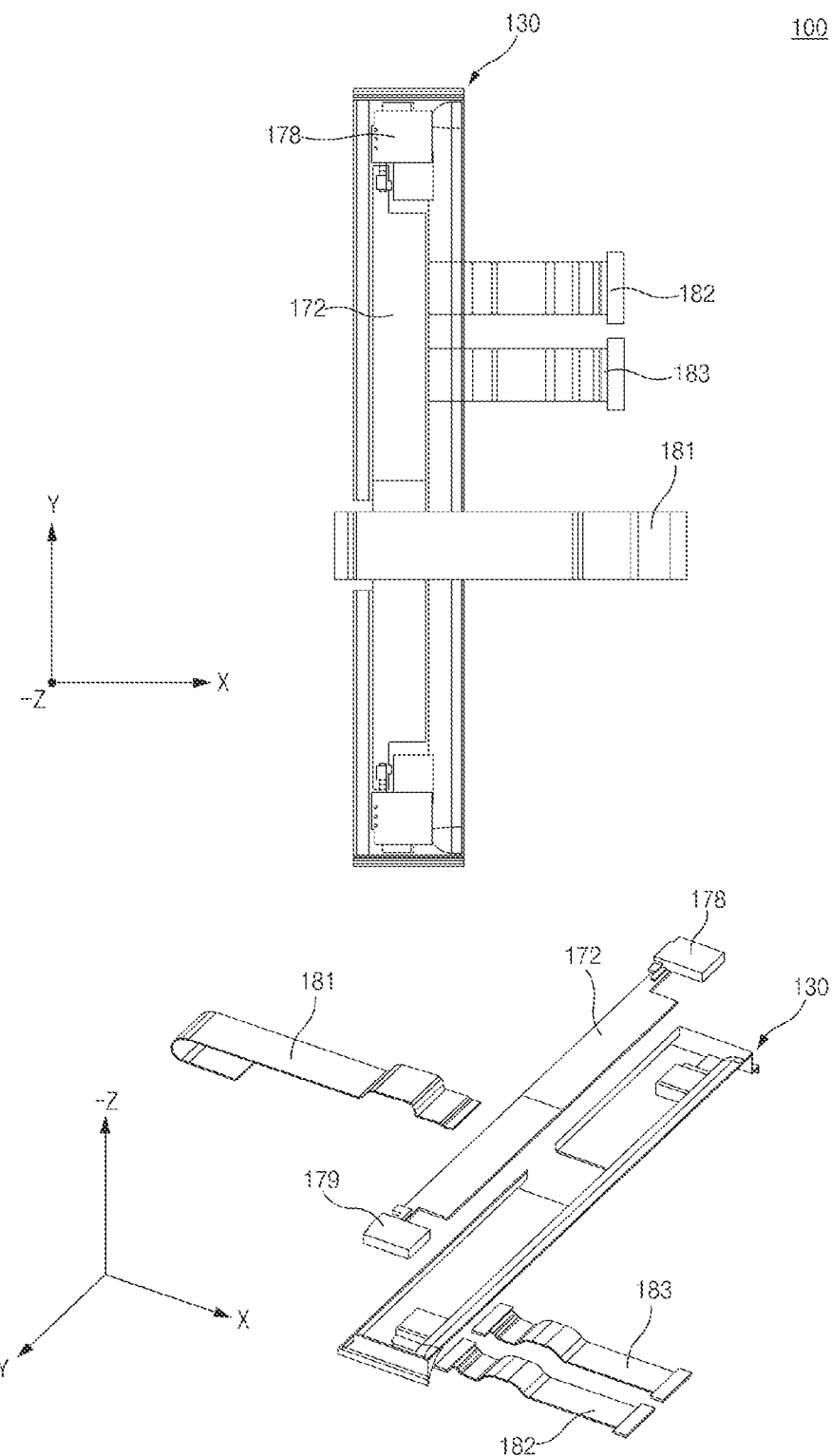
FIG. 15 is a diagram illustrating parts disposed on the sliding housing of the electronic device according to various embodiments.

FIG. 13 is a diagram illustrating an example arrangement of parts of the electronic device according to various embodiments. For example, FIG. 13 is a diagram illustrating a front part of the electronic device. FIG. 14 is a diagram illustrating an example arrangement of parts of the electronic device according to various embodiments. For example, FIG. 14 is a diagram illustrating a rear part of the electronic device. FIG. 15 is a diagram illustrating parts disposed on the sliding housing of the electronic device according to various embodiments. FIG. 16 is a diagram illustrating parts disposed on the folding housing of the electronic device according to various embodiments.

The electronic device 100 may include a plurality of parts. The plurality of components may be disposed on the base housing 110, the sliding housing 130, and the folding housing 140. The arrangements of the parts illustrated and described in FIGS. 13, 14, 15 and 16 (which may be referred to hereinafter as FIGS. 13 to 16) are merely illustrative, and internal structures of the electronic device 100 according to various embodiments of the disclosure are not limited to those illustrated in FIGS. 13 to 16.

Referring to FIGS. 13 and 14, the electronic device 100 may include the first circuit board 171, the second circuit board 172, the third circuit board 173, a first flexible circuit board 181, a second flexible circuit board 182, a third flexible circuit board 183, a first battery 175, and a second battery 176. Referring to FIG. 13, the second circuit board 172, the third circuit board 173, the second flexible circuit board 182, the third flexible circuit board 183, and the second battery 176 may be located on the front part of the electronic device 100 (e.g., in the +Z-axis direction). Referring to FIG. 14, the first circuit board 171 and the first battery 175 may be located on the rear part of the electronic device 100 (e.g., in the −Z-axis direction). Referring to FIGS. 13 and 14, the first flexible circuit board 181 may extend from the front part to the rear part.

Referring to FIG. 13, the sliding housing 130 and the folding housing 140 may be connected by the hinge modules 150 so as to be folded or unfolded. For example, the first rotary members 151 of the hinge modules 150 may be coupled to the folding housing 140, and the second rotary members 152 of the hinge modules 150 may be coupled to the sliding housing 130. The sliding housing 130 may be connected to the rolling module 165, and the sliding housing 130 and the rolling module 165 may move together.

Referring to FIG. 14, the first circuit board 171 and the first battery 175 may be disposed inside the base housing 110. For example, the first circuit board 171 and the first battery 175 may be disposed on the base plate 111 of the base housing 110. A rear camera module 107 may be disposed on the base plate 111. The rear camera module 107 may be electrically connected to the first circuit board 171. The first circuit board 171 may be electrically connected with the second circuit board 172, which is disposed on the sliding housing 130, through the first flexible circuit board 181. The first flexible circuit board 181 may at least partially extend into the space between the rolling module 165 and the base plate 111. The first flexible circuit board 181 may extend to surround the shaft 161 of the roller 160. The first circuit board 171 may include a connector connected with the display 190. For example, the connector may electrically connect a display driver IC and the first circuit board 171.

Referring to FIGS. 13 and 15, the second circuit board 172 may be disposed on the sliding housing 130. The second circuit board 172 may be electrically connected with the first circuit board 171 by the first flexible circuit board 181. For example, the first flexible circuit board 181 may have a sufficient length such that the electrical connection between the first circuit board 171 and the second circuit board 172 is maintained even in a state (e.g., the third state or the fourth state) in which the sliding housing 130 is slid in the X-axis direction. To this end, the first flexible circuit board 181 may further extend by the distance that the sliding housing 130 moves in the X-axis direction.

Referring to FIG. 15, the first speaker module 178 and the second speaker module 179 may be disposed on the sliding housing 130. The first speaker module 178 and the second speaker module 179 may be electrically connected with the second circuit board 172. The first speaker module 178 and the second speaker module 179 may move together with the sliding housing 130 and may provide a sound corresponding to deformation (extension/retraction) of the display area. In an embodiment, a speaker hole (e.g., the speaker hole 109 of FIG. 1) may be formed over a movement range of the sliding housing 130 to correspond to a change in the positions of the speaker modules 178 and 179.

Referring to FIGS. 13 and 16, the third circuit board 173, the second battery 176, and the front camera module 108 may be disposed on the folding housing 140.

Referring to FIGS. 13, 15, and 16, the second circuit board 172 and the third circuit board 173 may be electrically connected by the second flexible circuit board 182 and the third flexible circuit board 183. The second flexible circuit board 182 and the third flexible circuit board 183 may extend across a space in which in a folded state (e.g., the second state or the fourth state), the display 190 is accommodated. For example, referring to FIGS. 7A and B, the space in which the display 190 is accommodated may include the first recess 139 and the second recess 149. In an embodiment, the second flexible circuit board 182 and the third flexible circuit board 183 may have a sufficient length such that the electrical connection between the second circuit board 172 and the third circuit board 173 is maintained even in a folded state. For example, the second flexible circuit board 182 and the third flexible circuit board 183 may further extend by a length that is increased when the electronic device is in a folded state, as compared with when the electronic device is in a flat state.

Figure 17A:
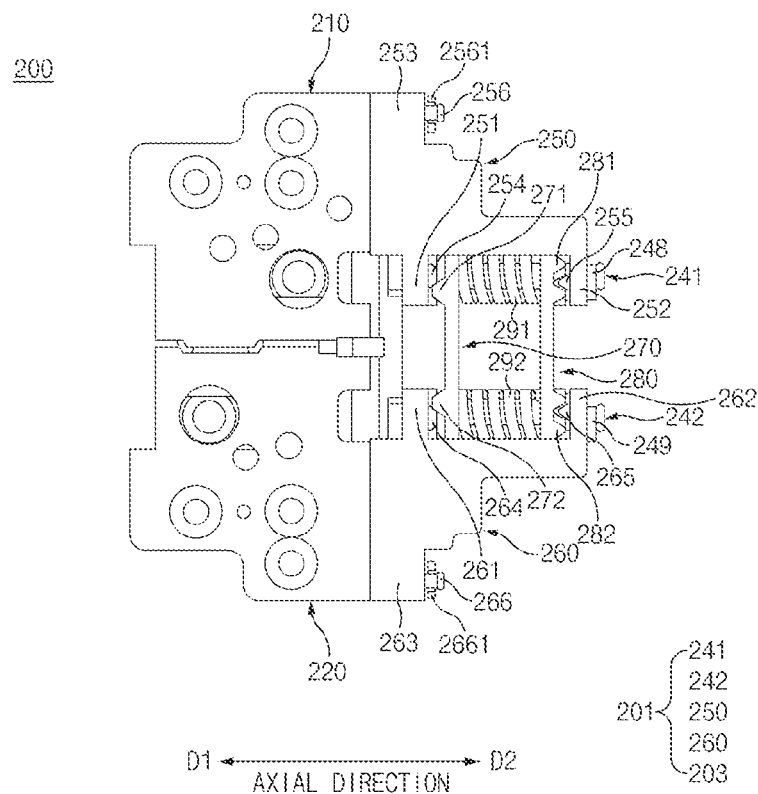
FIGS. 17A and 17B are diagrams illustrating an example hinge module of the electronic device according to various embodiments.
Figure 17B:
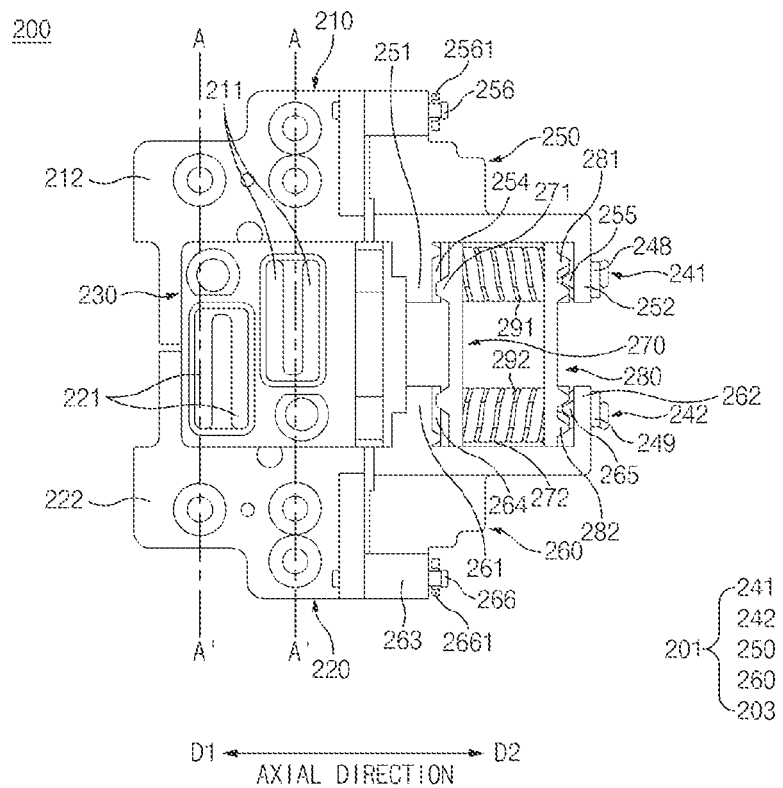
Figure 19A:
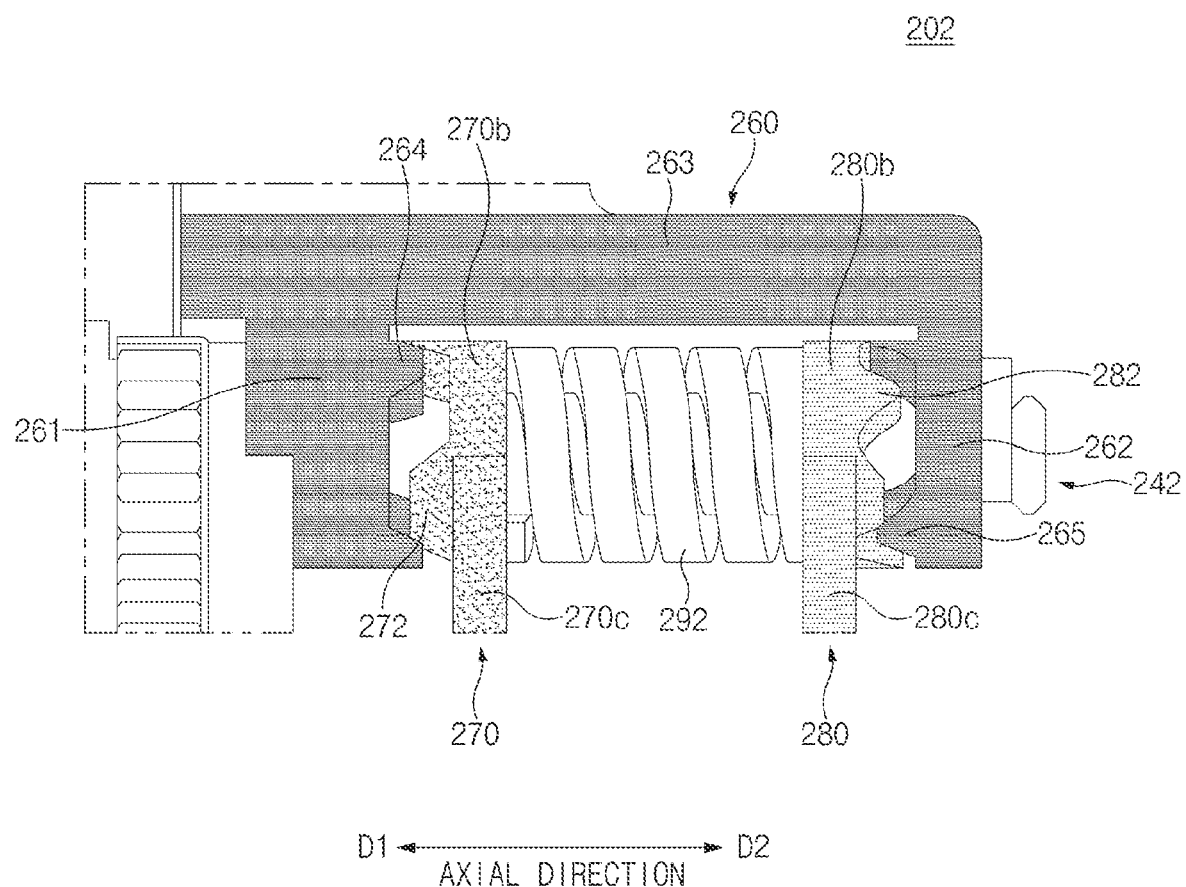
FIGS. 19A and 19B are diagrams illustrating a torque structure of the hinge module of the electronic device according to various embodiments.
Figure 19B:
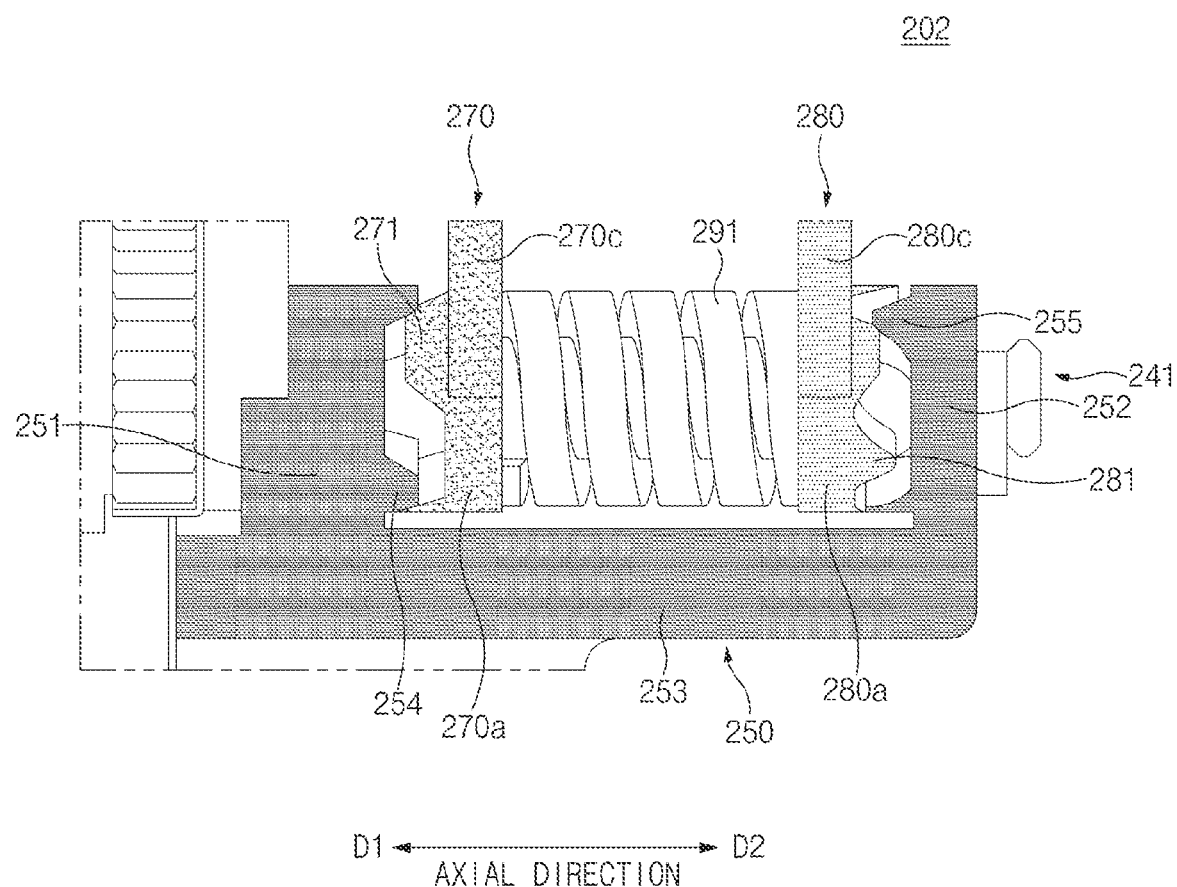

FIGS. 17A and 17B are diagrams illustrating an example hinge module of the electronic device according to various embodiments. FIG. 18 is an exploded perspective view illustrating the hinge module of the electronic device according to various embodiments. FIGS. 19A and 19B are diagrams illustrating the hinge module of the electronic device according to various embodiments.

FIGS. 17A and 17B are diagrams illustrating the hinge module according to various embodiments. FIG. 18 is an exploded perspective view of the hinge module according to various embodiments. FIG. 17A is a plan view of the hinge module as viewed in the +Z-axis direction. FIG. 17B is a plan view of the hinge module as viewed in the −Z-axis direction.

Referring to FIGS. 17A, 17B, and 18, axial directions may be defined. The axial directions may be directions (e.g., the Y-axis direction of FIG. 5) perpendicular to a sliding direction. The axial directions may be directions parallel to a shaft of a roller (e.g., the shaft 161 of the roller 160 of FIG. 5). The axial directions may be directions parallel to the direction in which the first axis of rotation R1 and the second axis of rotation R2 extend. For example, a first axial direction D1 may be a direction toward a fixing member 230, and a second axial direction D2 may be a direction toward a second cam member 280.

In an embodiment, the hinge module 200 (e.g., the hinge module 150 of FIGS. 7A and 7B) may include the fixing member 230, a first rotary member 210 (e.g., the first rotary member 151 of FIGS. 7A and 7B), a second rotary member 220 (e.g., the second rotary member 152 of FIGS. 7A and 7B), an arm structure 210, and a torque structure 202.

In an embodiment, at least part of the fixing member 230 may be disposed in a space (e.g., the first recess 139 and the second recess 149) between a sliding housing (e.g., the sliding housing 130 of FIGS. 7A and 7B) and a folding housing (e.g., the folding housing 140 of FIGS. 7A and 7B). The first rotary member 210 and the second rotary member 220 may be rotatably coupled to the fixing member 230.

In an embodiment, the fixing member 230 may include a first opening area 2391 to which a first guide portion 211 of the first rotary member 210 is coupled. In an embodiment, the fixing member 230 may include a first guide rail 233 for guiding a rotational path of the first rotary member 210. For example, the first guide rail 233 may be formed on a sidewall of the first opening area 2391. For example, the first guide rail 233 may be formed on at least one of opposite sidewalls of the first opening area 2391 that face the axial directions. In an embodiment, a first protruding portion 213 of the first rotary member 210 may be accommodated in the first guide rail 233.

In an embodiment, the fixing member 230 may include a second opening area 2392 to which a second guide portion 221 of the second rotary member 220 is coupled. In an embodiment, the fixing member 230 may include a second guide rail 234 for guiding a rotational path of the second rotary member 220. For example, the second guide rail 234 may be formed on a sidewall of the second opening area 2392. For example, the second guide rail 234 may be formed on at least one of opposite sidewalls of the second opening area 2392 that face the axial directions. In an embodiment, a second protruding portion 223 of the second rotary member 220 may be accommodated in the second guide rail 234.

In an embodiment, the first rotary member 210 may be configured to rotate along a predetermined path relative to the fixing member 230 when the folding housing (e.g., the folding housing 140 of FIGS. 6A to 6D, 7A, and 7B) and the sliding housing (e.g., the sliding housing 130 of FIGS. 6A to 6D, 7A, and 7B) are folded or unfolded. In an embodiment, the first rotary member 210 may include the first guide portion 211 rotatably coupled to the fixing member 230 and a first connecting portion 212 connected to the folding housing. In an embodiment, the first rotary member 210 may include the first protruding portion 213 formed on the first guide portion 211. The first protruding portion 213, together with the first guide rail 233, may guide the rotational path of the first rotary member 210.

In an embodiment, the second rotary member 220 may be configured to rotate along a predetermined path relative to the fixing member 230 when the folding housing (e.g., the folding housing 140 of FIGS. 6A to 6D, 7A, and 7B) and the sliding housing (e.g., the sliding housing 130 of FIGS. 6A to 6D, 7A, and 7B) are folded or unfolded. In an embodiment, the second rotary member 220 may include the second guide portion 221 rotatably coupled to the fixing member 230 and a second connecting portion 222 connected to the sliding housing. In an embodiment, the second rotary member 220 may include the second protruding portion 223 formed on the second guide portion 221. The second protruding portion 223, together with the second guide rail 234, may guide the rotational path of the second rotary member 220.

In an embodiment, the arm structure 201 may include a first arm shaft 241, a second arm shaft 242, a first arm part 250, a second arm part 260, and a gear structure 203 (e.g., the gear structure 153 of FIGS. 6A to 6D).

In an embodiment, the gear structure 203 may cause the first rotary member 210 and the second rotary member 220 to operate in conjunction with each other such that the first rotary member 210 and the second rotary member 220 rotate in opposite directions by the same angle. In an embodiment, the gear structure 203 may include a first gear 243 formed on an outer circumferential surface of the first arm shaft 241, a second gear 244 formed on an outer circumferential surface of the second arm shaft 242, and connecting gears 245 connecting the first gear 243 and the second gear 244. For example, the first gear 243 of the first arm shaft 241 and the second gear 244 of the second arm shaft 242 may be engaged through an even number of connecting gears 245. Accordingly, the first arm shaft 241 and the second arm shaft 242 may be engaged with each other to rotate in opposite directions by the same angle. The first arm part 250 coupled to the first arm shaft 241 and the second arm part 260 coupled to the second arm shaft 242 may rotate in opposite directions by the same angle. Accordingly, the first rotary member 210 and the second rotary member 220 may rotate in opposite directions by the same angle.

In an embodiment, the first arm shaft 241 may be rotatably coupled to the fixing member 230. For example, the first arm shaft 241 may extend from the fixing member 230 in the second axial direction D2. For example, an end portion of the first arm shaft 241 that faces the first axial direction D1 may be rotatably inserted into a recess or opening formed in the fixing member 230. For example, a first fixing ring 248 may be coupled to an end portion of the first arm shaft 241 that faces the second axial direction D2. The first fixing ring 248 may prevent the first arm shaft 241 from being separated from a second coupling portion 252 of the first arm part 250. In an embodiment, the first arm shaft 241, when viewed from the fixing member 230 in the second axial direction D2, may pass through a first coupling portion 251 of the first arm part 250, a first cam member 270, a first elastic member 291, the second cam member 280, and the second coupling portion 252 of the first arm part 250. For example, the first coupling portion 251 and the second coupling portion 252 of the first arm part 250 may be coupled to the first arm shaft 241 to rotate together with the first arm shaft 241. For example, the first coupling portion 251 and the second coupling portion 252 may be press-fit onto the first arm shaft 241. For example, the first arm shaft 241 may pass through the first cam member 270 and the second cam member 280. The first cam member 270 and the second cam member 280 may linearly move in the axial directions along the first arm shaft 241 without rotating together with the first arm shaft 241. For example, the first elastic member 291 may include a coil spring surrounding the first arm shaft 241. The first elastic member 291 may be compressed or stretched in the axial directions without rotating together with the first arm shaft 241.

In an embodiment, when the first rotary member 210 rotates, the first arm part 250 may rotate together with the first arm shaft 241 and may slide relative to the first rotary member 210. In an embodiment, the first arm part 250 may include the first coupling portion 251 and the second coupling portion 252 that are coupled to the first arm shaft 241, and a first extending portion 253 including a first sliding pin 256. The first coupling portion 251 and the second coupling portion 252 may extend from the first extending portion 253 in a direction perpendicular to the axial directions.

In an embodiment, a first arm cam 254 may be formed on the first coupling portion 251, and a second arm cam 255 may be formed on the second coupling portion 252. For example, the first arm cam 254 may be engaged with a first moving cam 271 of the first cam member 270. For example, the second arm cam 255 may be engaged with a third moving cam 281 of the second cam member 280. In an embodiment, the first arm cam 254 and the second arm cam 255 may be formed to face each other. For example, the first arm cam 254 may include a protrusion protruding in the second axial direction D2, and the second arm cam 255 may include a protrusion protruding in the first axial direction D1.

In an embodiment, in relation to rotation of the first arm part 250, the first coupling portion 251 and the second coupling portion 252 may be press-fit onto the first arm shaft 241. Accordingly, the first coupling portion 251 and the second coupling portion 252 may rotate together with the first arm shaft 241, and the first extending portion 253 may rotate about the first arm shaft 241. In an embodiment, the first coupling portion 251 and the second coupling portion 252 may be spaced apart from each other in the axial directions. For example, the first coupling portion 251 may be located in the first axial direction D1, compared to the second coupling portion 252. For example, the first elastic member 291, one portion of the first cam member 270, and one portion of the second cam member 280 may be disposed between the first coupling portion 251 and the second coupling portion 252.

In an embodiment, in relation to sliding of the first arm part 250, the first sliding pin 256 of the first extending portion 253 may be fastened to the first rotary member 210. For example, at least part of the first sliding pin 256 may be accommodated in a first sliding groove (e.g., a first sliding groove 215 of FIGS. 21A to 21C) of the first rotary member 210. For example, the first sliding pin 256 may move along the first sliding groove 215 when the first rotary member 210 rotates. A fixing ring 2561 may be coupled to an end portion of the first sliding pin 256. In an embodiment, when the first rotary member 210 rotates about the first axis of rotation R1, the first arm part 250 may rotate about the first arm shaft 241 while sliding relative to the first rotary member 210. For example, the first arm part 250 may slide in the state in which the first sliding pin 256 is fastened to the first rotary member 210.

In an embodiment, the second arm shaft 242 may be rotatably coupled to the fixing member 230. For example, the second arm shaft 242 may extend from the fixing member 230 in the second axial direction D2. For example, an end portion of the second arm shaft 242 that faces the first axial direction D1 may be rotatably inserted into a recess or opening formed in the fixing member 230. For example, a second fixing ring 249 may be coupled to an end portion of the second arm shaft 242 that faces the second axial direction D2. The second fixing ring 249 may prevent the second arm shaft 242 from being separated from a fourth coupling portion 262 of the second arm part 260. In an embodiment, the second arm shaft 242, when viewed from the fixing member 230 in the second axial direction D2, may pass through a third coupling portion 261 of the second arm part 260, the first cam member 270, a second elastic member 292, the second cam member 280, and the fourth coupling portion 262 of the second arm part 260. For example, the third coupling portion 261 and the fourth coupling portion 262 of the second arm part 260 may be coupled to the second arm shaft 242 to rotate together with the second arm shaft 242. For example, the third coupling portion 261 and the fourth coupling portion 262 may be press-fit onto the second arm shaft 242. For example, the second arm shaft 242 may pass through the first cam member 270 and the second cam member 280. The first cam member 270 and the second cam member 280 may linearly move in the axial directions along the second arm shaft 242 without rotating together with the second arm shaft 242. For example, the second elastic member 292 may include a coil spring surrounding the second arm shaft 242. The second elastic member 292 may be compressed or stretched in the axial directions without rotating together with the second arm shaft 242.

In an embodiment, when the second rotary member 220 rotates, the second arm part 260 may rotate together with the second arm shaft 242 and may slide relative to the second rotary member 220. In an embodiment, the second arm part 260 may include the third coupling portion 261 and the fourth coupling portion 262 that are coupled to the second arm shaft 242, and a second extending portion 263 including a second sliding pin 266. The third coupling portion 261 and the fourth coupling portion 262 may extend from the second extending portion 263 in a direction perpendicular to the axial directions.

In an embodiment, a third arm cam 264 may be formed on the third coupling portion 261, and a fourth arm cam 265 may be formed on the fourth coupling portion 262. For example, the third arm cam 264 may be engaged with a second moving cam 272 of the first cam member 270. For example, the fourth arm cam 265 may be engaged with a fourth moving cam 282 of the second cam member 280. In an embodiment, the third arm cam 264 and the fourth arm cam 265 may be formed to face each other. For example, the third arm cam 264 may include a protrusion protruding in the second axial direction D2, and the fourth arm cam 265 may include a protrusion protruding in the first axial direction D1.

In an embodiment, in relation to rotation of the second arm part 260, the third coupling portion 261 and the fourth coupling portion 262 may be press-fit onto the second arm shaft 242. Accordingly, the third coupling portion 261 and the fourth coupling portion 262 may rotate together with the second arm shaft 242, and the second extending portion 263 may rotate about the second arm shaft 242. In an embodiment, the third coupling portion 261 and the fourth coupling portion 262 may be spaced apart from each other in the axial directions. For example, the third coupling portion 261 may be located in the first axial direction D1, compared to the fourth coupling portion 262. For example, the second elastic member 292, another portion of the first cam member 270, and another portion of the second cam member 280 may be disposed between the third coupling portion 261 and the fourth coupling portion 262.

In an embodiment, in relation to sliding of the second arm part 260, the second sliding pin 266 of the second extending portion 263 may be fastened to the second rotary member 220. For example, at least part of the second sliding pin 266 may be accommodated in a second sliding groove (e.g., a second sliding groove 225 of FIGS. 21A to 21C) of the second rotary member 220. For example, the second sliding pin 266 may move along the second sliding groove when the second rotary member 220 rotates. A fixing ring 2661 may be coupled to an end portion of the second sliding pin 266. In an embodiment, when the second rotary member 220 rotates about the second axis of rotation R2, the second arm part 260 may rotate about the second arm shaft 242 while sliding relative to the second rotary member 220. For example, the second arm part 260 may slide in the state in which the second sliding pin 266 is fastened to the second rotary member 220.

FIGS. 19A and 19B are diagrams illustrating the torque structure of the hinge module according to various embodiments.

In an embodiment, the torque structure 202 may provide friction torque corresponding to restoring torque of the display 190. For example, in a folded state (e.g., FIGS. 2 and 4) in which a partial area of the display 190 is curved, a restoring force of the display 190 may act on the first rotary member 210 and the second rotary member 220. For example, the restoring force of the display 190 may be a force by which the display 190 returns to a flat state. Restoring torque may be applied to the first arm shaft 241 and the second arm shaft 242 by the restoring force. For example, the restoring torque may act on the first arm shaft 241 in the counterclockwise direction that is an unfolding direction and may act on the second arm shaft 242 in the clockwise direction that is an unfolding direction. Accordingly, the torque structure 202 may provide predetermined friction torque that cancels out the restoring torque such that the hinge module 200 and/or the display 190 is maintained in the folded state. For example, the friction torque may be proportional to a surface friction force between cam structures and the distance between the point where the friction force is generated and the arm shaft 241 or 242 (e.g., the radius of the arm shaft 241 or 242). The surface friction force may be increased by the elastic member 291 or 292 in a compressed state.

In an embodiment, the torque structure 202 may include the first arm cam 254, the second arm cam 255, the third arm cam 264, the fourth arm cam 265, the first cam member 270, the second cam member 280, the first elastic member 291, and the second elastic member 292.

FIG. 19B is a diagram illustrating torque structures coupled to the first arm shaft 241. Referring to FIG. 19B, when viewed from the first gear 243 in the second axial direction D2, the first arm cam 254, the first moving cam 271 of the first cam member 270, the first elastic member 291, the third moving cam 281 of the second cam member 280, and the second arm cam 255 may be coupled to the first arm shaft 241.

FIG. 19A is a diagram illustrating torque structures coupled to the second arm shaft 242. Referring to FIG. 19A, when viewed from the second gear 244 in the second axial direction D2, the third arm cam 264, the second moving cam 272 of the first cam member 270, the second elastic member 292, the fourth moving cam 282 of the second cam member 280, and the fourth arm cam 265 may be coupled to the second arm shaft 242.

In an embodiment, the first arm cam 254 may be formed on the first coupling portion 251 of the first arm part 250. The first arm cam 254 may rotate together with the first arm shaft 241. For example, the first arm cam 254 may be formed to surround the first arm shaft 241. The first arm cam 254 may include the protrusion protruding in the second axial direction D2. The first arm cam 254 may be engaged with the first moving cam 271 of the first cam member 270.

In an embodiment, the second arm cam 255 may be formed on the second coupling portion 252 of the first arm part 250. The second arm cam 255 may rotate together with the first arm shaft 241. For example, the second arm cam 255 may be formed to surround the first arm shaft 241. The second arm cam 255 may include the protrusion protruding in the first axial direction D1. The second arm cam 255 may be engaged with the third moving cam 281 of the second cam member 280.

In an embodiment, the third arm cam 264 may be formed on the third coupling portion 261 of the second arm part 260. The third arm cam 264 may rotate together with the second arm shaft 242. For example, the third arm cam 264 may be formed to surround the second arm shaft 242. The third arm cam 264 may include the protrusion protruding in the second axial direction D2. The third arm cam 264 may be engaged with the second moving cam 272 of the first cam member 270.

In an embodiment, the fourth arm cam 265 may be formed on the fourth coupling portion 262 of the second arm part 260. The fourth arm cam 265 may rotate together with the second arm shaft 242. For example, the fourth arm cam 265 may be formed to surround the second arm shaft 242. The fourth arm cam 265 may include the protrusion protruding in the first axial direction D1. The fourth arm cam 265 may be engaged with the fourth moving cam 282 of the second cam member 280.

In an embodiment, the first cam member 270 may include a first portion 270a through which the first arm shaft 241 passes, a second portion 270b through which the second arm shaft 242 passes, and a first bridge portion 270c connecting the first portion 270a and the second portion 270b. In an embodiment, the first moving cam 271 may be formed on the first portion 270a. The first moving cam 271 may be engaged with the first arm cam 254. For example, the first moving cam 271 may include a protrusion protruding in the first axial direction D1. In an embodiment, the second moving cam 272 may be formed on the second portion 270b. The second moving cam 272 may be engaged with the third arm cam 264. For example, the second moving cam 272 may include a protrusion protruding in the first axial direction D1. In an embodiment, when the first arm shaft 241 and the second arm shaft 242 rotate, the first cam member 270 may move in the axial directions without rotating. For example, the first arm shaft 241 may include a portion having a polygonal cross-section when viewed in the axial directions. The first portion 270a of the first cam member 270 may have a circular through-hole when viewed in the axial directions. The portion of the first arm shaft 241 that has a polygonal cross-section may extend through the circular through-hole of the first portion 270a. Accordingly, the first cam member 270 may not rotate even though the first arm shaft 241 rotates.

In an embodiment, the second cam member 280 may include a third portion 280a through which the first arm shaft 241 passes, a fourth portion 280b through which the second arm shaft 242 passes, and a second bridge portion 280c connecting the third portion 280a and the fourth portion 280b. In an embodiment, the third moving cam 281 may be formed on the third portion 280a. The third moving cam 281 may be engaged with the second arm cam 255. For example, the third moving cam 281 may include a protrusion protruding in the second axial direction D2. In an embodiment, the fourth moving cam 282 may be formed on the fourth portion 280b. The fourth moving cam 282 may be engaged with the fourth arm cam 265. For example, the fourth moving cam 282 may include a protrusion protruding in the second axial direction D2. In an embodiment, when the first arm shaft 241 and the second arm shaft 242 rotate, the second cam member 280 may move in the axial directions without rotating. For example, the second arm shaft 242 may include a portion having a polygonal cross-section when viewed in the axial directions. The second portion 270b of the first cam member 270 may have a circular through-hole when viewed in the axial directions. The portion of the second arm shaft 242 that has a polygonal cross-section may extend through the circular through-hole of the second portion 270b. Accordingly, the first cam member 270 may not rotate even though the second arm shaft 242 rotates.

In an embodiment, the first elastic member 291 may be disposed between the first cam member 270 and the second cam member 280. For example, the first elastic member 291 may be disposed between the first coupling portion 251 of the first arm part 250 and the second coupling portion 252 of the first arm part 250. For example, the first elastic member 291 may be disposed between the first portion 270a of the first cam member 270 and the third portion 280a of the second cam member 280. For example, the first elastic member 291 may be located in the second axial direction D2 from the first cam member 270 and may be located in the first axial direction D1 from the second cam member 280. In an embodiment, the first elastic member 291 may be compressed or stretched in response to linear movements of the first cam member 270 and the second cam member 280 in the axial directions. For example, the first elastic member 291 in a compressed state may increase a friction force between the first moving cam 271 and the first arm cam 254 and/or a friction force between the third moving cam 281 and the second arm cam 255. The increased friction force may provide increased friction torque acting in an opposite direction to a rotational direction of the first arm shaft 241.

In an embodiment, the second elastic member 292 may be disposed between the first cam member 270 and the second cam member 280. For example, the second elastic member 292 may be disposed between the third coupling portion 261 of the second arm part 260 and the fourth coupling portion 262 of the second arm part 260. For example, the second elastic member 292 may be disposed between the second portion 270b of the first cam member 270 and the fourth portion 280b of the second cam member 280. For example, the second elastic member 292 may be located in the second axial direction D2 from the first cam member 270 and may be located in the first axial direction D1 from the second cam member 280. In an embodiment, the second elastic member 292 may be compressed or stretched in response to linear movements of the first cam member 270 and the second cam member 280 in the axial directions. For example, the second elastic member 292 in a compressed state may increase a friction force between the second moving cam 272 and the third arm cam 264 and/or a friction force between the fourth moving cam 282 and the fourth arm cam 265. The increased friction force may provide increased friction torque acting in an opposite direction to a rotational direction of the second arm shaft 242.

In an embodiment, when the first arm shaft 241 and the second arm shaft 242 rotate, the structures included in the torque structure 202 may rotate in place, or may linearly move along the first arm shaft 241 and the second arm shaft 242.

For example, the first arm cam 254 and the second arm cam 255 may rotate together with the first arm shaft 241 and may not linearly move in the direction in which the first arm shaft 241 extends. For example, the first arm shaft 241 may include the portion having a polygonal cross-section when viewed in the axial directions. Each of the first arm cam 254 and the second arm cam 255 may have a through-hole through which the first arm shaft 241 passes. The through-hole, when viewed in the axial directions, may have a polygonal cross-section corresponding to the cross-section of the first arm shaft 241. Accordingly, when the first arm shaft 241 rotates, the first arm cam 254 and the second arm cam 255 may rotate together with the first arm shaft 241. In various embodiments, the first arm cam 254 and the second arm cam 255 may be at least partially press-fit onto the first arm shaft 241. Accordingly, linear movements of the first arm cam 254 and the second arm cam 255 along the first arm shaft 241 may be limited.

For example, the third arm cam 264 and the fourth arm cam 265 may rotate together with the second arm shaft 242 and may not linearly move in the direction in which the second arm shaft 242 extends. For example, the second arm shaft 242 may include the portion having a polygonal cross-section when viewed in the axial directions. Each of the third arm cam 264 and the fourth arm cam 265 may have a through-hole through which the second arm shaft 242 passes. The through-hole, when viewed in the axial directions, may have a polygonal cross-section corresponding to the cross-section of the second arm shaft 242. Accordingly, when the second arm shaft 242 rotates, the third arm cam 264 and the fourth arm cam 265 may rotate together with the second arm shaft 242. In various embodiments, the third arm cam 264 and the fourth arm cam 265 may be at least partially press-fit onto the second arm shaft 242. Accordingly, linear movements of the third arm cam 264 and the fourth arm cam 265 along the second arm shaft 242 may be limited.

For example, when the arm shafts 241 and 242 rotate, the first moving cam 271 and the second moving cam 272 may linearly move together in the axial directions by the first bridge portion 270c without rotating. For example, when the arm shafts 241 and 242 rotate, the third moving cam 281 and the fourth moving cam 282 may linearly move together in the axial directions by the second bridge portion 280c without rotating. For example, when the arm shafts 241 and 242 rotate, the first elastic member 291 and the second elastic member 292 may be compressed or stretched depending on the distance between the first cam member 270 and the second cam member 280 without rotating. For example, the first elastic member 291 may be compressed when the first cam member 270 moves in the second axial direction D2 and the second cam member 280 moves in the first axial direction D1.

Figure 20A:
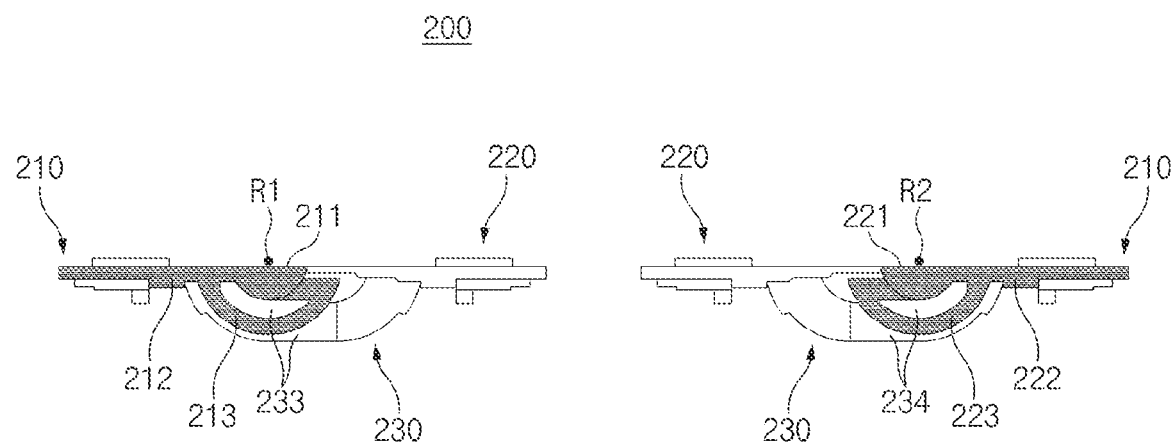
FIGS. 20A, 20B and 20C are sectional views illustrating motions of a first rotary member and a second rotary member of the hinge module of the electronic device according to various embodiments.
Figure 20B:
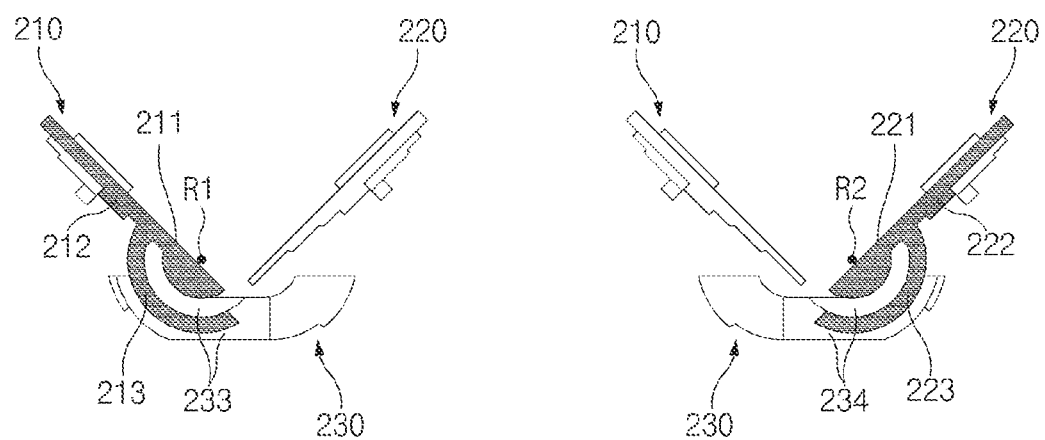
Figure 20C:
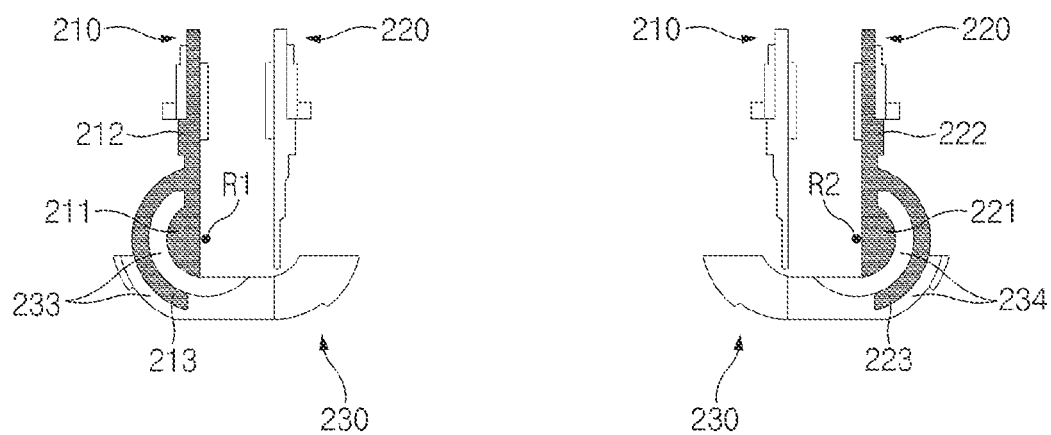

FIGS. 20A, 20B and 20C (which may be referred to hereinafter as FIGS. 20A to 20C) are sectional views illustrating rotary motions of the rotary members of the hinge module according to various embodiments. FIGS. 20A to 20C are sectional views taken along line A-A' of FIG. 17B.

FIG. 20A is a sectional view illustrating the hinge module 200 in a flat state. FIG. 20B is a sectional view illustrating the hinge module 200 in a folded state. FIG. 20C is a sectional view illustrating the hinge module 200 in a fully folded state.

In an embodiment, the first guide rail 233 and the second guide rail 234 may be formed on the fixing member 230. In an embodiment, the first guide rail 233 may have a substantially circular arc shape. For example, the center of the circular arc of the first guide rail 233 may be the first axis of rotation R1. That is, the first guide rail 233 may guide the first rotary member 210 such that the first rotary member 210 rotates along a rotational path having the first axis of rotation R1 as a center. In an embodiment, the second guide rail 234 may have a substantially circular arc shape. For example, the center of the circular arc of the second guide rail 234 may be the second axis of rotation R2. That is, the second guide rail 234 may guide the second rotary member 220 such that the second rotary member 220 rotates along a rotational path having the second axis of rotation R2 as a center.

In an embodiment, the first rotary member 210 may include the first connecting portion 212 and the first guide portion 211. The first guide portion 211 may have a substantially cylindrical shape. For example, the cross-section of the first guide portion 211 may have a substantially circular arc shape. In an embodiment, the first rotary member 210 may rotate about the first axis of rotation R1 in the state in which the first protruding portion 213 of the first guide portion 211 is accommodated in the first guide rail 233 of the fixing member 230. For example, the first rotary member 210 may rotate along the circular arc-shaped rotational path having the first axis of rotation R1 as a center.

In an embodiment, the second rotary member 220 may include the second connecting portion 222 and the second guide portion 221. The second guide portion 221 may have a substantially cylindrical shape. For example, the cross-section of the second guide portion 221 may have a substantially circular arc shape. In an embodiment, the second rotary member 220 may rotate about the second axis of rotation R2 in the state in which the second protruding portion 223 is accommodated in the second guide rail 234. For example, the second rotary member 220 may rotate along the circular arc-shaped rotational path having the second axis of rotation R2 as a center.

In an embodiment, the first axis of rotation R1 and the second axis of rotation R2 may be parallel to the axial directions of the hinge module 200. In an embodiment, the first axis of rotation R1 and the second axis of rotation R2 may be formed above the first connecting portion 212 of the first rotary member 210 and the second connecting portion 222 of the second rotary member 220 in the Z-axis direction.

Referring to FIG. 20A, in the flat state, the first connecting portion 212 may limit, to one direction, a direction in which the first rotary member 210 is rotatable. For example, a first end portion of the first guide rail 233 may be open, and a second end portion of the first guide rail 233 may be covered by the first connecting portion 212. Accordingly, in the flat state, the first rotary member 210 is rotatable about the first axis of rotation R1 in the clockwise direction and is not rotatable in the counterclockwise direction.

Referring to FIG. 20A, in the flat state, the second connecting portion 222 may limit, to one direction, a direction in which the second rotary member 220 is rotatable. For example, a third end portion of the second guide rail 234 may be open, and a fourth end portion of the second guide rail 233 may be covered by the second connecting portion 222. Accordingly, in the flat state, the second rotary member 220 is rotatable about the second axis of rotation R2 in the counterclockwise direction and is not rotatable in the clockwise direction.

Figure 21A:
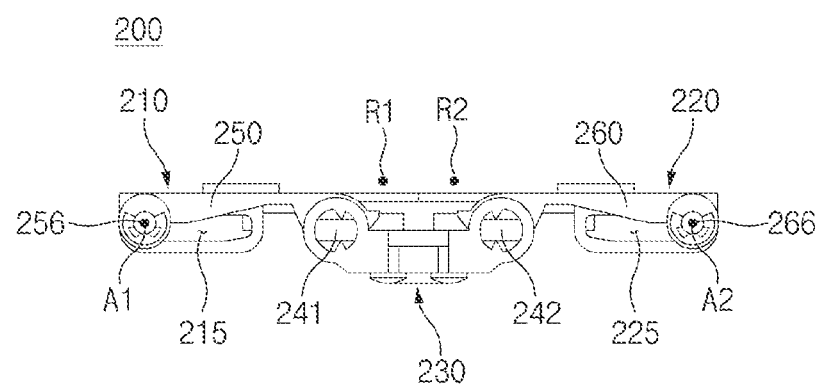
FIGS. 21A, 21B and 21C are sectional views illustrating a first arm part, a second arm part, the first rotary member, and the second rotary member of the hinge module of the electronic device according to various embodiments.
Figure 21B:
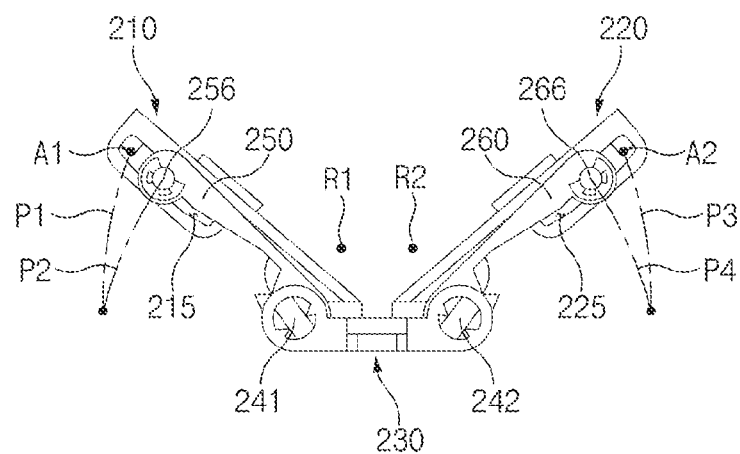
Figure 21C:
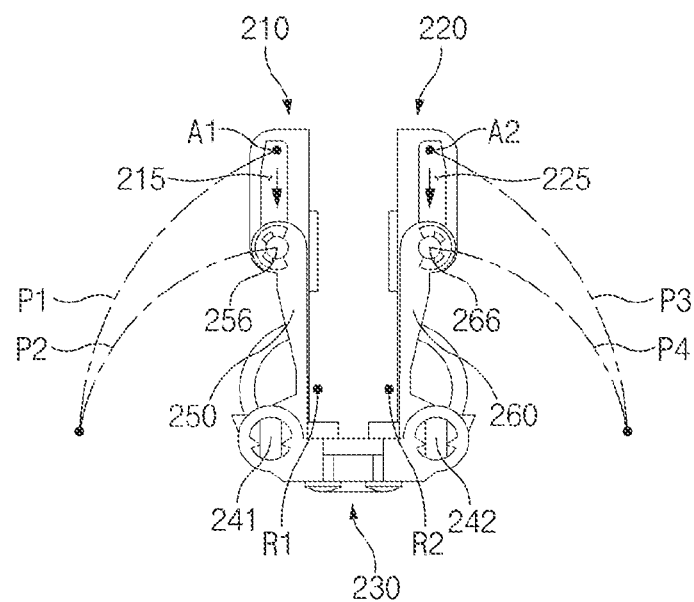

FIGS. 21A, 21B and 21C (which may be referred to hereinafter as FIGS. 21A to 21C) are sectional views illustrating rotary motions and sliding motions of the arm parts and the rotary members of the hinge module according to various embodiments.

FIG. 21A is a sectional view illustrating the hinge module 200 in a flat state. FIG. 21B is a sectional view illustrating the hinge module 200 in a folded state. FIG. 21C is a sectional view illustrating the hinge module 200 in a fully folded state.

Referring to FIGS. 21A to 21C, when the hinge module 200 is folded or unfolded, the rotary members 210 and 220 and the arm parts 250 and 260 may rotate about different axes. For example, the rotary members 210 and 220 and the arm parts 250 and 260 may rotate along different rotational paths. Due to the difference in rotational path between the rotary members 210 and 220 and the arm parts 250 and 250, the arm parts 250 and 260 may slide when the hinge module 200 is folded or unfolded.

In an embodiment, the first rotary member 210 may rotate about the first axis of rotation R1 in a first rotational direction. For example, in a folding motion, the first rotary member 210 may rotate in the clockwise direction. For example, based on the flat state, the point where the first sliding pin 256 is located in the first rotary member 210 may be defined as a first point A1. In folding and unfolding motions, the first point A1 of the first rotary member 210 may move along a first rotational path P1.

Referring to FIGS. 21A to 21C, the first arm part 250 and the first sliding pin 256 may rotate about the first arm shaft 241. For example, in a folding motion, the first arm part 250 and the first sliding pin 256 may rotate in the clockwise direction. For example, in the flat state, the first sliding pin 256 may be located at the first point A1, and in the folded state, the first sliding pin 256 may be located at a position spaced apart from the first point A1 in a direction perpendicular to the axial directions. The first sliding pin 256 may move along a second rotational path P2 in folding and unfolding motions.

In various embodiments, the first rotational path P1 and the second rotational path P2 may differ from each other. For example, the first axis of rotation R1 and the first arm shaft 241 may be parallel to each other, but may not be in agreement with each other, and the radii of rotation of the first rotary member 210 and the first arm part 250 may not be in agreement with each other.

Accordingly, in folding and unfolding motions, the first arm part 250 and the first sliding pin 256 may slide relative to the first rotary member 210. The sliding motion of the first sliding pin 256 and the first arm part 250 may be guided as the first sliding pin 256 is accommodated in the first sliding groove 215 of the first rotary member 210. In an embodiment, when a folding motion is performed from the flat state, the distance between the first sliding pin 256 and the first point A1 may increase. When an unfolding motion is performed from the fully folded state, the distance between the first sliding pin 256 and the first point A1 may decrease.

In an embodiment, the second rotary member 220 may rotate about the second axis of rotation R2 in a second rotational direction. For example, in a folding motion, the second rotary member 220 may rotate in the counterclockwise direction. For example, based on the flat state, the point where the second sliding pin 266 is located in the second rotary member 220 may be defined as a second point A2. In folding and unfolding motions, the second point A2 may move along a third rotational path P3.

In an embodiment, the second arm part 260 and the second sliding pin 266 may rotate about the second arm shaft 242. For example, in a folding motion, the second arm part 260 and the second sliding pin 266 may rotate in the counterclockwise direction. For example, in the flat state, the second sliding pin 266 may be located at the second point A2, and in the folded state, the second sliding pin 266 may be located at a position spaced apart from the second point A2 in a direction perpendicular to the axial directions. The second sliding pin 266 may move along a fourth rotational path P4 in folding and unfolding motions.

In various embodiments, the third rotational path P3 and the fourth rotational path P4 may differ from each other. For example, the second axis of rotation R2 and the second arm shaft 242 may be parallel to each other, but may not be in agreement with each other, and the radii of rotation of the second rotary member 220 and the second arm part 260 may not be in agreement with each other.

Accordingly, in folding and unfolding motions, the second arm part 260 and the second sliding pin 266 may slide relative to the second rotary member 220. The sliding motion of the second sliding pin 266 and the second arm part 260 may be guided as the second sliding pin 266 is accommodated in the second sliding groove 225 of the second rotary member 220. In an embodiment, when a folding motion is performed from the flat state, the distance between the second sliding pin 266 and the second point A2 may increase. When an unfolding motion is performed from the fully folded state, the distance between the second sliding pin 266 and the second point A2 may decrease.

FIG. 22 is a block diagram illustrating an example electronic device in a network environment according to various embodiments.

Referring to FIG. 22, an electronic device 2201 in a network environment 2200 may communicate with at least one of an electronic device 2202 via a first network 2298 (e.g., a short-range wireless communication network), or an electronic device 2204 or a server 2208 via a second network 2299 (e.g., a long-range wireless communication network). According to an embodiment, the electronic device 2201 may communicate with the electronic device 2204 via the server 2208. According to an embodiment, the electronic device 2201 may include the processor 2220, a memory 2230, an input module 2250, a sound output module 2255, a display module 2260, an audio module 2270, a sensor module 2276, an interface 2277, a connecting terminal 2278, a haptic module 2279, a camera module 2280, a power management module 2288, a battery 2289, a communication module 2290, a subscriber identification module (SIM) 2296, or an antenna module 2297. In some embodiments, at least one (e.g., the connecting terminal 2278) of the components may be omitted from the electronic device 2201, or one or more other components may be added in the electronic device 2201. In some embodiments, some of the components (e.g., the sensor module 2276, the camera module 2280, or the antenna module 2297) may be implemented as single component (e.g., the display module 2260).

The processor 2220 may execute, for example, software (e.g., a program 2240) to control at least one other component (e.g., a hardware or software component) of the electronic device 2201 coupled with the processor 2220, and may perform various data processing or computation. According to an embodiment, as at least part of the data processing or computation, the processor 2220 may load a command or data received from another component (e.g., the sensor module 2276 or the communication module 2290) in a volatile memory 2232, process the command or the data stored in the volatile memory 2232, and store resulting data in a non-volatile memory 2234. According to an embodiment, the processor 2220 may include a main processor 2221 (e.g., a central processing unit (CPU) or an application processor (AP)), and an auxiliary processor 2223 (e.g., a graphics processing unit (GPU), a neural processing unit (NPU), an image signal processor (ISP), a sensor hub processor, or a communication processor (CP)) that is operable independently from, or in conjunction with, the main processor 2221. For example, when the electronic device 2201 includes the main processor 2221 and the auxiliary processor 2223, the auxiliary processor 2223 may be adapted to consume less power than the main processor 2221, or to be specific to a specified function. The auxiliary processor 2223 may be implemented as separate from, or as part of the main processor 2221.

The auxiliary processor 2223 may control at least some of functions or states related to at least one component (e.g., the display module 2260, the sensor module 2276, or the communication module 2290) among the components of the electronic device 2201, instead of the main processor 2221 while the main processor 2221 is in an inactive (e.g., sleep) state, or together with the main processor 2221 while the main processor 2221 is in an active state (e.g., executing an application). According to an embodiment, the auxiliary processor 2223 (e.g., an image signal processor or a communication processor) may be implemented as part of another component (e.g., the camera module 2280 or the communication module 2290) functionally related to the auxiliary processor 2223. According to an embodiment, the auxiliary processor 2223 (e.g., the neural processing unit) may include a hardware structure specified for artificial intelligence model processing. An artificial intelligence model may be generated by machine learning. Such learning, for example, may be performed in the electronic device 2201 itself in which the artificial intelligence model is performed, or may be performed through a separate server (e.g., the server 2208). Learning algorithms may include, but are not limited to, supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. Additionally or alternatively, the artificial intelligence model may include a software structure other than the hardware structure.

The memory 2230 may store various data used by at least one component (e.g., the processor 2220 or the sensor module 2276) of the electronic device 2201. The various data may include, for example, software (e.g., the program 2240) and input data or output data for a command related thereto. The memory 2230 may include the volatile memory 2232 or the non-volatile memory 2234.

The program 2240 may be stored in the memory 2230 as software, and may include, for example, an operating system (OS) 2242, middleware 2244, or an application 2246.

The input module 2250 may receive a command or data to be used by other component (e.g., the processor 2220) of the electronic device 2201, from the outside (e.g., a user) of the electronic device 2201. The input module 2250 may include, for example, a microphone, a mouse, a keyboard, a key (e.g., a button), or a digital pen (e.g., a stylus pen).

The sound output module 2255 may output sound signals to the outside of the electronic device 2201. The sound output module 2255 may include, for example, a speaker or a receiver. The speaker may be used for general purposes, such as playing multimedia or playing record. The receiver may be used for an incoming call. According to an embodiment, the receiver may be implemented as separate from, or as part of the speaker.

The display module 2260 may visually provide information to the outside (e.g., a user) of the electronic device 2201. The display module 2260 may include, for example, a display, a hologram device, or a projector and control circuitry to control a corresponding one of the display, hologram device, and projector. According to an embodiment, the display module 2260 may include a touch sensor adapted to detect a touch, or a pressure sensor adapted to measure the intensity of force incurred by the touch.

The audio module 2270 may convert a sound into an electrical signal and vice versa. According to an embodiment, the audio module 2270 may obtain the sound via the input module 2250, or output the sound via the sound output module 2255 or an external electronic device (e.g., an electronic device 2202) (e.g., speaker of headphone) directly (e.g., wiredly) or wirelessly coupled with the electronic device 2201.

The sensor module 2276 may detect an operational state (e.g., power or temperature) of the electronic device 2201 or an environmental state (e.g., a state of a user) external to the electronic device 2201, and then generate an electrical signal or data value corresponding to the detected state. According to an embodiment, the sensor module 2276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2277 may support one or more specified protocols to be used for the electronic device 2201 to be coupled with the external electronic device (e.g., the electronic device 2202) directly (e.g., wiredly) or wirelessly. According to an embodiment, the interface 2277 may include, for example, a high definition multimedia interface (HDMI), a universal serial bus (USB) interface, a secure digital (SD) card interface, or an audio interface.

A connecting terminal 2278 may include a connector via which the electronic device 2201 may be physically connected with the external electronic device (e.g., the electronic device 2202). According to an embodiment, the connecting terminal 2278 may include, for example, a HDMI connector, a USB connector, a SD card connector, or an audio connector (e.g., a headphone connector).

The haptic module 2279 may convert an electrical signal into a mechanical stimulus (e.g., a vibration or a movement) or electrical stimulus which may be recognized by a user via his tactile sensation or kinesthetic sensation. According to an embodiment, the haptic module 2279 may include, for example, a motor, a piezoelectric element, or an electric stimulator.

The camera module 2280 may capture a still image or moving images. According to an embodiment, the camera module 2280 may include one or more lenses, image sensors, image signal processors, or flashes.

The power management module 2288 may manage power supplied to the electronic device 2201. According to an embodiment, the power management module 2288 may be implemented as at least part of, for example, a power management integrated circuit (PMIC).

The battery 2289 may supply power to at least one component of the electronic device 2201. According to an embodiment, the battery 2289 may include, for example, a primary cell which is not rechargeable, a secondary cell which is rechargeable, or a fuel cell.

The communication module 2290 may support establishing a direct (e.g., wired) communication channel or a wireless communication channel between the electronic device 2201 and the external electronic device (e.g., the electronic device 2202, the electronic device 2204, or the server 2208) and performing communication via the established communication channel. The communication module 2290 may include one or more communication processors that are operable independently from the processor 2220 (e.g., the application processor (AP)) and supports a direct (e.g., wired) communication or a wireless communication. According to an embodiment, the communication module 2290 may include a wireless communication module 2292 (e.g., a cellular communication module, a short-range wireless communication module, or a global navigation satellite system (GNSS) communication module) or a wired communication module 2294 (e.g., a local area network (LAN) communication module or a power line communication (PLC) module). A corresponding one of these communication modules may communicate with the external electronic device 2204 via the first network 2298 (e.g., a short-range communication network, such as Bluetooth™, wireless-fidelity (Wi-Fi) direct, or infrared data association (IrDA))

or the second network 2299 (e.g., a long-range communication network, such as a legacy cellular network, a 5G network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2292 may identify or authenticate the electronic device 2201 in a communication network, such as the first network 2298 or the second network 2299, using subscriber information (e.g., international mobile subscriber identity (IMSI)) stored in the subscriber identification module 2296.

The wireless communication module 2292 may support a 5G network after a 4G network and next-generation communication technology, for example, new radio (NR) access technology. The NR access technology may support enhanced mobile broadband (eMBB), massive machine type communications (mMTC), or ultra-reliable and low-latency communications (URLLC). To achieve a high data transmission rate, the wireless communication module 2292 may support, for example, a high-frequency band (e.g., the mmWave band). The wireless communication module 2292 may support various technologies for securing performance on a high-frequency band. For example, the wireless communication module 2292 may support technologies such as beam-forming, massive multiple-input and multiple-output (massive MIMO), full dimensional MINO (FD-MIMO), array antenna, analog beam-forming, and large scale antenna. The wireless communication module 2292 may support various requirements specified in the electronic device 2201, an external electronic device (e.g., the electronic device 2204), or a network system (e.g., the second network 2299). According to an embodiment, the wireless communication module 2292 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 2297 may transmit or receive a signal or power to or from the outside (e.g., the external electronic device) of the electronic device 2201. According to an embodiment, the antenna module 2297 may include an antenna including a radiating element including a conductive material or a conductive pattern formed in or on a substrate (e.g., PCB). According to an embodiment, the antenna module 2297 may include a plurality of antennas (e.g., an array antenna). In such a case, at least one antenna appropriate for a communication scheme used in the communication network, such as the first network 2298 or the second network 2299, may be selected, for example, by the communication module 2290 from the plurality of antennas. The signal or the power may then be transmitted or received between the communication module 2290 and the external electronic device via the selected at least one antenna. According to an embodiment, another component (e.g., a radio frequency integrated circuit (RFIC)) other than the radiating element may be additionally formed as part of the antenna module 2297.

According to various embodiments, the antenna module 2297 may form a mmWave antenna module. According to an embodiment, the mmWave antenna module may include a printed circuit board, an RFIC that is disposed on a first surface (e.g., the bottom surface) of the printed circuit board or is disposed adjacent to the first surface and that is capable of supporting a specified high-frequency band (e.g., the mmWave band), and a plurality of antennas (e.g., array antennas) that are disposed on a second surface (e.g., the top surface or a side surface) of the printed circuit board or are disposed adjacent to the second surface and that are capable of transmitting or receiving signals of the specified high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2201 and the external electronic device 2204 via the server 2208 coupled with the second network 2299. Each of the external electronic devices 2202 or 2204 may be a device of a same type as, or a different type, from the electronic device 2201. According to an embodiment, all or some of operations to be executed at the electronic device 2201 may be executed at one or more of the external electronic devices 2202, 2204, or 2208. For example, when the electronic device 2201 should perform a function or a service automatically, or in response to a request from a user or another device, the electronic device 2201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2201. The electronic device 2201 may provide the outcome, with or without further processing of the outcome, as at least part of a reply to the request. To that end, a cloud computing, distributed computing, mobile edge computing (MEC), or client-server computing technology may be used, for example. The electronic device 2201 may provide, for example, ultra low-latency services using distributed computing or mobile edge computing. In another embodiment, the external electronic device 2204 may include an internet-of-things (IoT) device. The server 2208 may be an intelligent server using machine learning and/or a neural network. According to an embodiment, the external electronic device 2204 or the server 2208 may be included in the second network 2299. The electronic device 2201 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2240) including one or more instructions that are stored in a storage medium (e.g., internal memory 2236 or external memory 2238) that is readable by a machine (e.g., the electronic device 2201). For example, a processor (e.g., the processor 2220) of the machine (e.g., the electronic device 2201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities are separated and disposed in another component. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The electronic device according to various embodiments of the disclosure may independently perform a sliding motion and a folding motion. Furthermore, the electronic device may detect a state of the electronic device through sensors disposed in at least some of the base housing, the sliding housing, and the folding housing and may provide a user interface and user experience that are appropriate for the detected state.

In addition, the disclosure may provide various effects that are directly or indirectly recognized.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
    a first sensor;
    a second sensor;
    a third sensor;
    at least one processor electrically connected with the first sensor, the second sensor and the third sensor;
    a base housing, wherein the third sensor is disposed on the base housing;
    a sliding housing at least partially overlapping the base housing and slidably coupled to the base housing, wherein the first sensor is disposed on the sliding housing;
    a folding housing at least partially overlapping the base housing and connected to the sliding housing, wherein the second sensor is disposed on the folding housing;
    a display disposed on the folding housing and the sliding housing, at least part of the display being located inside the base housing;
    a rolling module comprising a rollable support coupled to a rear surface of the display, the rolling module having one side connected to the sliding housing and an opposite side extending into an inner space of the base housing; and
    a hinge module comprising a hinge connected to the folding housing and the sliding housing, wherein the sliding housing is configured to rotate about a first axis of rotation and the folding housing is configured to rotate about a second axis of rotation,
    wherein the at least one processor is configured to detect whether the electronic device is in a sliding-in state or a sliding-out state based on sensor signals representing a distance between the first sensor and the third sensor, and whether the electronic device is in a folded state or a flat state based on sensor signals representing a distance between the first sensor and the second sensor and a distance between the first sensor and the third sensor, wherein the electronic device is configured to be capable of performing:

a sliding motion wherein the folding housing and the sliding housing are configured to move in a sliding direction to extend and/or retract a display area of the electronic device; and a folding motion wherein the folding housing is configured to be folded or unfolded relative to the sliding housing to fold or unfold part of a display area.

2. The electronic device of claim 1, wherein the electronic device is configured such that the sliding motion and the folding motion are performed independently of each other.

3. The electronic device of claim 1, wherein the base housing includes a first cover defining a rear side of the electronic device, and a first side cover and a second side cover connected to the first cover, wherein a first guide rail extending in a sliding direction is provided on the first side cover and/or the second side cover, and a protruding portion of the sliding housing is accommodated in the first guide rail, and wherein the sliding housing is configured to slide in a state in which the protruding portion is at least partially accommodated in the first guide rail.

4. The electronic device of claim 3, wherein a second guide rail in which at least part of the rolling module is configured to be accommodated is provided on the first side cover and/or the second side cover, and wherein the second guide rail includes a curved section and a straight section.

5. The electronic device of claim 1, further comprising:

a roller rotatably coupled to the base housing and at least partially surrounded by the rolling module, wherein the roller is configured to rotate based on the sliding motion being performed.

6. The electronic device of claim 5, wherein a shaft of the roller extends in a direction substantially perpendicular to a moving direction of the sliding housing.

7. The electronic device of claim 1, wherein the rolling module includes a plurality of bars flexibly connected with each other, and wherein the plurality of bars extend in a direction substantially perpendicular to a moving direction of the sliding housing.

8. The electronic device of claim 1, wherein the hinge module includes:

a fixing portion;

a first rotary portion rotatably coupled to the fixing portion and configured to rotate about the first axis of rotation and connected to the sliding housing; and a second rotary portion rotatably coupled to the fixing portion and configured to rotate about the second axis of rotation and connected to the folding housing, wherein the first axis of rotation and the second axis of rotation are substantially perpendicular to a moving direction of the sliding housing, and wherein the hinge module further includes a gear structure comprising a gear configured to cause the first rotary portion and the second rotary portion to operate in conjunction with each other such that the first rotary portion and the second rotary portion rotate in opposite directions by substantially the same angle.

9. The electronic device of claim 8, wherein the hinge module further includes:

a first arm shaft parallel to the first axis of rotation and configured to rotate in conjunction with rotation of the first rotary portion;

first cam structures comprising a cam mounted on the first arm shaft and engaged with each other in a direction of the first arm shaft;

a first elastic portion mounted on the first arm shaft and configured to be compressed or stretched by the first cam structures;

a second arm shaft parallel to the second axis of rotation and configured to rotate in conjunction with rotation of the second rotary portion;

second cam structures comprising a cam mounted on the second arm shaft and engaged with each other in a direction of the second arm shaft; and a second elastic portion mounted on the second arm shaft and configured to be compressed or stretched by the second cam structures.

10. The electronic device of claim 9, wherein the electronic device includes a free stop section wherein an angle formed by the folding housing and the sliding housing is between a first angle and a second angle, and wherein the first elastic portion and the second elastic portion are in a compressed state in the free stop section.

11. The electronic device of claim 1, wherein each of the first sensor and the second sensor includes a magnet and/or a coil, and wherein the third sensor includes a Hall sensor configured to sense a magnetic field generated by the magnet and/or the coil.

12. An electronic device comprising: a base housing;

a sliding housing at least partially overlapping the base housing and slidably coupled to the base housing;

a folding housing at least partially overlapping the base housing and connected to the sliding housing;

a display disposed on the folding housing and the sliding housing, at least part of the display being located inside the base housing;

a rolling module comprising a rollable support coupled to a rear surface of the display, the rolling module having one side connected to the sliding housing and an opposite side extending into an inner space of the base housing; and a hinge module comprising a hinge connected to the folding housing and the sliding housing, wherein the sliding housing is configured to rotate about a first axis of rotation and the folding housing is configured to rotate about a second axis of rotation, wherein the electronic device is configured to be capable of performing:

a sliding motion wherein the folding housing and the sliding housing are configured to move in a sliding direction to extend and/or retract a display area of the electronic device; and a folding motion wherein the folding housing is configured to be folded or unfolded relative to the sliding housing to fold or unfold part of a display area, wherein the display includes a first area disposed on at least part of the folding housing, a second area disposed on at least part of the sliding housing, and a third area disposed in the inner space of the base housing, and wherein the electronic device is configured to include:

a first state in which the first area and the second area form a front side of the electronic device and the third area is disposed in the inner space;

a second state in which the first area is folded with a predetermined angle relative to the second area and the third area is disposed in the inner space;

a third state in which at least part of the third area forms the front side together with the first area and the second area; and a fourth state in which at least part of the third area forms the front side together with the first area and the second area and the first area is folded with a predetermined angle relative to the second area.

13. The electronic device of claim 12, wherein based on the electronic device being changed from the first state or the second state to the third state or the fourth state, the sliding housing and the folding housing are configured to move in a first sliding direction, and the rolling module and the third area of the display are configured to be pulled from the inner space of the base housing by the sliding housing.

14. The electronic device of claim 12, wherein the display includes a bending area between the first area and the second area and capable of being deformed to be a curved surface or a flat surface, and wherein the bending area is configured to be deformed from a flat surface to a curved surface based on the electronic device being changed from the first state or the third state to the second state or the fourth state.

15. The electronic device of claim 14, wherein a space extending in a direction of the first axis of rotation and the second axis of rotation is provided between the sliding housing and the folding housing, wherein at least part of the hinge module is disposed in the space, and wherein the bending area of the display is at least partially accommodated in the space based on the electronic device being in the second state or the fourth state.

16. The electronic device of claim 12, wherein the display includes a bending area between the first area and the second area and capable of being deformed to be a curved surface or a flat surface, wherein the electronic device further comprises a fourth sensor coupled to the display to at least partially overlap the bending area and at least one processor electrically connected with the fourth sensor, wherein the at least one processor is configured to detect a folded state or a flat state of the folding housing based on a signal of the fourth sensor.

17. The electronic device of claim 16, wherein the fourth sensor includes a thin-film pressure sensor.

18. An electronic device comprising:

a base housing;

a sliding housing at least partially overlapping the base housing and slidably coupled to the base housing;

a folding housing at least partially overlapping the base housing and connected to the sliding housing;

a display disposed on the folding housing and the sliding housing, at least part of the display being located inside the base housing;

a rolling module comprising a rollable support coupled to a rear surface of the display, the rolling module having one side connected to the sliding housing and an opposite side extending into an inner space of the base housing; and a hinge module comprising a hinge connected to the folding housing and the sliding housing, wherein the sliding housing is configured to rotate about a first axis of rotation and the folding housing is configured to rotate about a second axis of rotation;

a first circuit board disposed in the base housing;

a second circuit board disposed in the sliding housing; and a first flexible circuit board connecting the first circuit board and the second circuit board, wherein the first flexible circuit board is at least partially surrounded by the rolling module and is configured to extend to surround at least part of a shaft of a roller, and wherein the electronic device is configured to be capable of performing:

a sliding motion wherein the folding housing and the sliding housing are configured to move in a sliding direction to extend and/or retract a display area of the electronic device; and a folding motion wherein the folding housing is configured to be folded or unfolded relative to the sliding housing to fold or unfold part of a display area.

19. The electronic device of claim 18, further comprising:

a third circuit board disposed in the folding housing; and a second flexible circuit board connecting the second circuit board and the third circuit board, wherein the second flexible circuit board is configured to extend across a space in which the hinge module is disposed and a bending area of the display is accommodated.

* * * * *